US009025382B2

(12) United States Patent
Rhie

(10) Patent No.: US 9,025,382 B2
(45) Date of Patent: May 5, 2015

(54) LITHOGRAPHY-FRIENDLY LOCAL READ CIRCUIT FOR NAND FLASH MEMORY DEVICES AND MANUFACTURING METHOD THEREOF

(71) Applicant: Conversant Intellectual Property Management Inc., Ottawa (CA)

(72) Inventor: Hyoung Seub Rhie, Ottawa (CA)

(73) Assignee: Conversant Intellectual Property Management Inc., Plano, TX (US)

(*) Notice: Subject to any disclaimer, the term of this patent is extended or adjusted under 35 U.S.C. 154(b) by 0 days.

(21) Appl. No.: 13/829,436

(22) Filed: Mar. 14, 2013

(65) Prior Publication Data

US 2014/0269087 A1    Sep. 18, 2014

(51) Int. Cl.
| | |
|---|---|
| *G11C 16/04* | (2006.01) |
| *G11C 16/26* | (2006.01) |
| *G11C 16/10* | (2006.01) |
| *G11C 7/18* | (2006.01) |
| *G11C 16/08* | (2006.01) |
| *G11C 16/24* | (2006.01) |
| *H01L 27/115* | (2006.01) |
| *H01L 27/02* | (2006.01) |

(52) U.S. Cl.
CPC .............. *G11C 16/26* (2013.01); *G11C 16/10* (2013.01); *G11C 7/18* (2013.01); *G11C 16/08* (2013.01); *G11C 16/24* (2013.01); *H01L 27/0207* (2013.01); *H01L 27/11519* (2013.01); *H01L 27/11529* (2013.01); *H01L 27/11531* (2013.01)

(58) Field of Classification Search
CPC ................................................ H01L 27/10885
See application file for complete search history.

(56) References Cited

U.S. PATENT DOCUMENTS

| | | |
|---|---|---|
| 5,473,563 A | 12/1995 | Suh et al. |
| 6,560,162 B2 | 5/2003 | Kwon |
| 7,161,837 B2 | 1/2007 | Park |
| 7,440,326 B2 | 10/2008 | Ito |
| 7,525,841 B2 | 4/2009 | Aritome |
| 7,551,492 B2 | 6/2009 | Kim |
| 7,852,676 B2 | 12/2010 | Maejima |
| 7,885,115 B2 | 2/2011 | Lee et al. |
| 7,940,578 B2 | 5/2011 | Kang et al. |
| 7,944,752 B2 | 5/2011 | Lee |
| 7,978,518 B2 | 7/2011 | Pyeon et al. |
| 7,994,011 B2 | 8/2011 | Park et al. |
| 8,045,386 B2 | 10/2011 | Santin et al. |
| 8,085,616 B2 | 12/2011 | Ryu |

(Continued)

FOREIGN PATENT DOCUMENTS

EP    2387039 A1    11/2011

OTHER PUBLICATIONS

Suh, Kang-Deog, et al.; "A 3.3 V 32 Mb NAND Flash Memory with Incremental Step Pulse Programming Scheme"; IEEE Journal of Solid-State Circuits; vol. 30, No. 11; Nov. 1995; 8 pages.

(Continued)

*Primary Examiner* — Gene Auduong
(74) *Attorney, Agent, or Firm* — Conley Rose, P.C.; J. Robert Brown, Jr.

(57) ABSTRACT

A flash memory device comprising a local sensing circuitry is provided in a hierarchical structure with local and global bit lines. The local sensing circuitry comprise read and pass circuits configured to sense and amplify read currents during read operations, wherein the amplified read signals may be passed to a global circuit via the local and global bit lines.

16 Claims, 22 Drawing Sheets

(56) References Cited

U.S. PATENT DOCUMENTS

| | | | |
|---|---|---|---|
| 8,179,735 B2* | 5/2012 | Wu | 365/203 |
| 8,189,390 B2 | 5/2012 | Kim | |
| 8,189,391 B2 | 5/2012 | Itagaki et al. | |
| 8,199,573 B2 | 6/2012 | Fukuzumi et al. | |
| 8,203,211 B2 | 6/2012 | Jeong | |
| 8,203,882 B2 | 6/2012 | Hishida et al. | |
| 8,259,503 B2 | 9/2012 | Park et al. | |
| 8,264,031 B2 | 9/2012 | Kidoh et al. | |
| 8,278,170 B2 | 10/2012 | Lee et al. | |
| 8,278,695 B2 | 10/2012 | Kidoh et al. | |
| 2005/0232058 A1* | 10/2005 | Yabe | 365/230.03 |
| 2006/0083062 A1 | 4/2006 | Park | |
| 2009/0027984 A1* | 1/2009 | Mizuno et al. | 365/203 |
| 2011/0170352 A1 | 7/2011 | Kim | |
| 2011/0261616 A1* | 10/2011 | Kim | 365/163 |
| 2011/0305099 A1* | 12/2011 | Sharma et al. | 365/203 |
| 2012/0181699 A1 | 7/2012 | Chen et al. | |
| 2012/0182802 A1 | 7/2012 | Hung et al. | |
| 2012/0182806 A1 | 7/2012 | Chen et al. | |
| 2012/0218845 A1 | 8/2012 | Takayama et al. | |
| 2013/0039137 A1* | 2/2013 | Yasuda | 365/194 |

OTHER PUBLICATIONS

Tanaka, H., et al.; "Bit Cost Scalable Technology with Punch and Plug Process for Ultra High Density Flash Memory"; 2007 Symposium on VLSI Technology Digest of Technical Papers; Jun. 2007; 2 pages.

Jang, Jaehoon, et al.; "Vertical Cell Array Using TCAT (Terabit Cell Array Transistor) Technology for Ultra High Density NAND Flash Memory"; 2009 Symposium on VLSI Technology Digest of Technical Papers; Jun. 2009; 2 pages.

Fukuzumi, Yoshiaki, et al.; "Optimal Integration and Characteristics of Vertical Array Devices for Ultra-High Density, Bit-Cost Scalable Flash Memory"; IEEE; Dec. 2007; 4 pages.

Lue, Hang-Ting, et al.; "A Highly Scalable 8-Layer 3D Vertical-Gat (VG) TFT NAND Flash Using Junction-Free Buried Channel BE-SONOS Device"; 2010 Symposium on VLSI Technology Digest of Technical Papers; Jun. 2010; 2 pages.

Chang, Kuo-Pin, et al.; "Memory Architecture of 3D Vertical Gate (3DVG) NAND Flash Using Plural Island-Gate SSL Decoding Method and Study of It's Program Inhibit Characteristics"; IEEE; May 2012; 4 pages.

Chen, Shih-Hung, et al.; "A Highly Scalable 8-Layer Vertical Gate 3D NAND with Split-Page Bit Line Layout and Efficient Binary-sum MiLC (Minimal Incremental Layer Cost) Staircase Contacts"; IEEE; Dec. 2012; 4 pages.

Hung, Chun-Hsiung, et al.; "Design Innovations to Optimize the 3D Stackable Vertical Gate (VG) NAND Flash"; IEEE; Dec. 2012; 4 pages.

Nakamura, Hiroshi, et al.; "A Novel Sense Amplifier for Flexible Voltage Operation NAND Flash Memories"; 1995 Symposium on VLSI Technology Digest of Technical Papers; Jun. 1995; 2 pages.

Walker, Andrew J., et al.; "Sub-50-nm Dual-Gate Thin-Film Transistors for Monolithic 3-D Flash"; IEEE Transaction on Electron Devices; vol. 56, No. 11; Nov. 2009; 8 pages.

PCT International Search Report; PCT Application No. PCT/CA2014/000213; mailed Jun. 4, 2014; 3 pgs.

PCT Written Opinion of the International Searching Authority; PCT/CA2014/000213; mailed Jun. 4, 2014; 5 pages.

Yoohyun Noh et al, "A New Metal Control Gate Last Process (MCGL Process) for High Performance DC-SF (Dual Control Gate With Surrounding Floating Gate) 3D NAND Flash Memory", 2012 Symposium on VLSI Technology Digest of Technical Papers; Jun. 2012, pp. 19-20.

Akihiro Nitayama et al, "Bit Cost Scalable (BiCS) Flash Technology for Future Ultra High Density Storage Devices", VLSI Technology Systems and Applications (VLSI TSA), 2010 International Symposium, Apr. 2010, pp. 130-131.

Megumi Ishiduki et al, "Optimal Device Structure for Pipe-shaped BiCS Flash Memory for Ultra High Density Storage Device with Excellent Performance and Reliability", Electron Devices Meeting (IEDM), 2009 IEEE International, Dec. 2009, pp. 27.3.1-27.3.4.

Ryota Katsumata et al, "Pipe-shaped BiCS Flash Memory with 16 Stacked Layers and Multi-Level-Cell Operation for Ultra High Density Storage Devices", 2009 VLSI Technology Symposium, Jun. 2009, pp. 136-137.

Ki-Tae Park et al, "A 45nm 4Gb 3-Dimensional Double-Stacked Multi-Level NAND Flash Memory with Shared Bitline Structure", Solid-State Circuits Conference, ISSCC 2008 Digest of Technical Papers, Feb. 6, 2008, pp. 510-511 and 632.

Jin-Ki Kim et al, "A 120mm2 64Mb NAND Flash Memory Achieving 180ns/Byte Effective Program Speed", 1996 Symposium on VLSI Circuits Digest of Technical Papers, Jun. 1996, pp. 168-169.

June Lee, June et al, "High-Performance 1-Gb NAND Flash Memory with .012-um Technology", IEEE Jounal of Solid-State Circuits, vol. 37, No. 11, Nov. 2002, pp. 1502-1509.

Ki-Tae Park et al, "A Novel NAND Flash Memory With Asymmetric S/D Structure Using Fringe-Field-Induced Inversion Layer", IEEE Transactions on Electron Devices, vol. 55, No. 1, Jan. 1, 2008, pp. 404-410.

Hang-Ting Lue et al, "A Novel Junction-Free BE-SONOS NAND Flash", 2008 Symposium on VLSI Technology Digest of Technical Papers, Jan. 2008, pp. 140-141.

Chang-Hyun Lee et al, "Highly Scalable NAND Flash Memory with Robust Immunity to Program Disturbance Using Symmetric Inversion-Type Source and Drain Structure", 2008 Symposium on VLSI Technology Digest of Technical Papers, Jun. 2008, pp. 118-119.

Dongyean Oh et al, "A New Self-Boosting Phenomenon by Soure/Drain Depletion Cut-off in NAND Flash Memory", 2007 IEEE Non-Volatile Semiconductor Memory Workshop, Aug. 2007, pp. 39-41.

Il Han Park et al, "Depletion-Enhanced Body-Isolation (DEBI) Array on SOI for Highly Scalable and Reliable NAND Flash Memories", IEEE Transactions on Nanotechnology, vol. 5, No. 3, May 2006, pp. 201-204.

Tae-Sung Jung et al, "A 117-MM2 3.3-V Only 128-Mb Multilevel NAND Flash Memory for Mass Storage Applications", IEEE Journal of Solid-State Circuits, vol. 31, No. 11, Nov. 1996, pp. 1575-1583.

A. Hubert et al, "A Stacked SONOS Technology, up to 4 Levels and 6nm Crystalline Nanowires, with Gate-all-around or Independent Gates (PHI-Flash), Suitable for Full 3D Integration", 2009 IEEE International Electron Devices Meeting, Dec. 2009, pp. 27.6.1-27.6.4.

Chih Ping Chen et al, "A Highly Pitch Scalable 3D Vertical Gate (VG) NAND Flash Decoded by a Novel Self-Aligned Independently Controlled Double Gate (IDG) String Select Transistor (SSL)", 2012 Symposium on VLSI Technology Digest of Technical Papers, Jun. 2012, pp. 91-92.

Hyun-Jin Cho et al, "Modeling of Surrounding Gate MOSFETs With Bulk Trap States", IEEE Transactions on Electron Devices, vol. 54, No. 1, Jan. 2007, pp. 166-169.

Meikei Ieong et al, "DC and AC Performance Analysis of 25 nm Symmetric/Asymmetric Double-Gate, Back-Gate and Bulk CMOS", 2000 Simulation of Semiconductor Processes and Devices, Sep. 2000, pp. 147-150.

L. Crippa et al, "Nonvolatile Memories: NOR vs. NAND Architectures", Memories in Wireless Systems, Aug. 2008, pp. 29-53.

Yosuke Komori et al, "Disturbless Flash Memory due to High Boost Efficiency on BiCS Structure and Optimal Memory Film Stack for Ultra High Density Storage Device", 2008 Electron Devices Meeting, Dec. 2008, 4 pages.

* cited by examiner

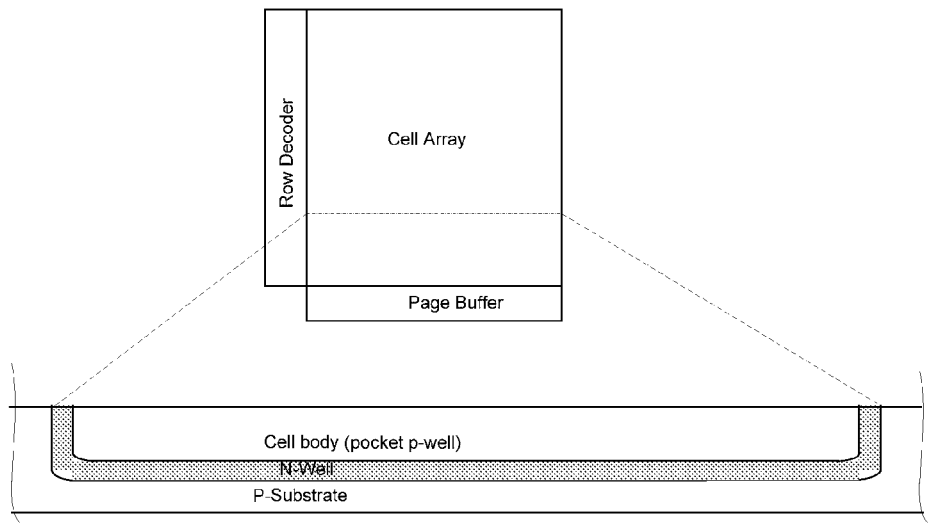

FIG. 13

|  | Selected Block | Unselected Block |
|---|---|---|
| Bitlines (BL) | Clamped to V_erase-0.6V | Clamped to V_erase-0.6V |
| String Select Line (SSL) | Boosted to approx. 90% of V_erase | Boosted to approx. 90% of V_erase |
| Wordlines (WL0 ~ WL15) | 0V | Boosted to approx. 90% of V_erase |
| Ground Select Line (GSL) | Boosted to approx. 90% of V_erase | Boosted to approx. 90% of V_erase |
| Source Line (SL) | Clamped to V_erase-0.6V | Clamped to V_erase-0.6V |
| Cell body | V_erase | V_erase |

FIG. 14

LITHOGRAPHY-FRIENDLY LOCAL READ CIRCUIT FOR NAND FLASH MEMORY DEVICES AND MANUFACTURING METHOD THEREOF

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Non-volatile memory such as flash memory is widely employed in consumer electronics and storage applications, e.g., USB flash drivers, portable media players, cell phones, digital cameras, etc. Two common types of flash memory include NOR and NAND flash memories. NOR flash memory provides a full address and data interface that allows random access to any location, whereas NAND flash memory typically provides faster erase and write times, higher density, and lower cost per bit. Since many applications rely upon fast and random accessibility to data, products have been developed to combine the advantages of both NOR and NAND flash memories.

An example of such a product is a NAND flash memory device having an embedded controller on a single integrated circuit (IC). This type of device employs a NAND flash array to store and access data at a high speed with reduced cost and size. Further, control logic accesses and writes to the flash array in response to commands, thereby providing an interface with greater accessibility to data (e.g., comparable to that of a NOR flash memory device).

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 13 is a schematic diagram illustrating cell substrate structure.

FIG. 14 is a table illustrating bias conditions during an erase operation.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In general, it would be desirable to provide a NAND flash memory device with an embedded controller that can exploit the speed and efficiency benefits of NAND flash memory, as well as the accessibility benefits of NOR flash memory. To this end, disclosed herein are embodiments of a NAND flash memory device comprising a local sensing circuitry provided in a hierarchical structure with local and global bit lines. The local sensing circuitry may include read and pass circuits configured to sense and amplify read currents at relatively low levels, wherein the amplified read signals may be passed to a global circuit via the local and global bit lines. In addition, the local circuits may be arranged such that the read and pass circuits for each local bit line may be located at opposite ends. In this manner, a lithography-friendly arrangement may be provided for designing a NAND flash memory device with local circuitry capable of sensing low read currents during read operations.

Organization of a NAND Flash Memory Cell Array

Figure 1:
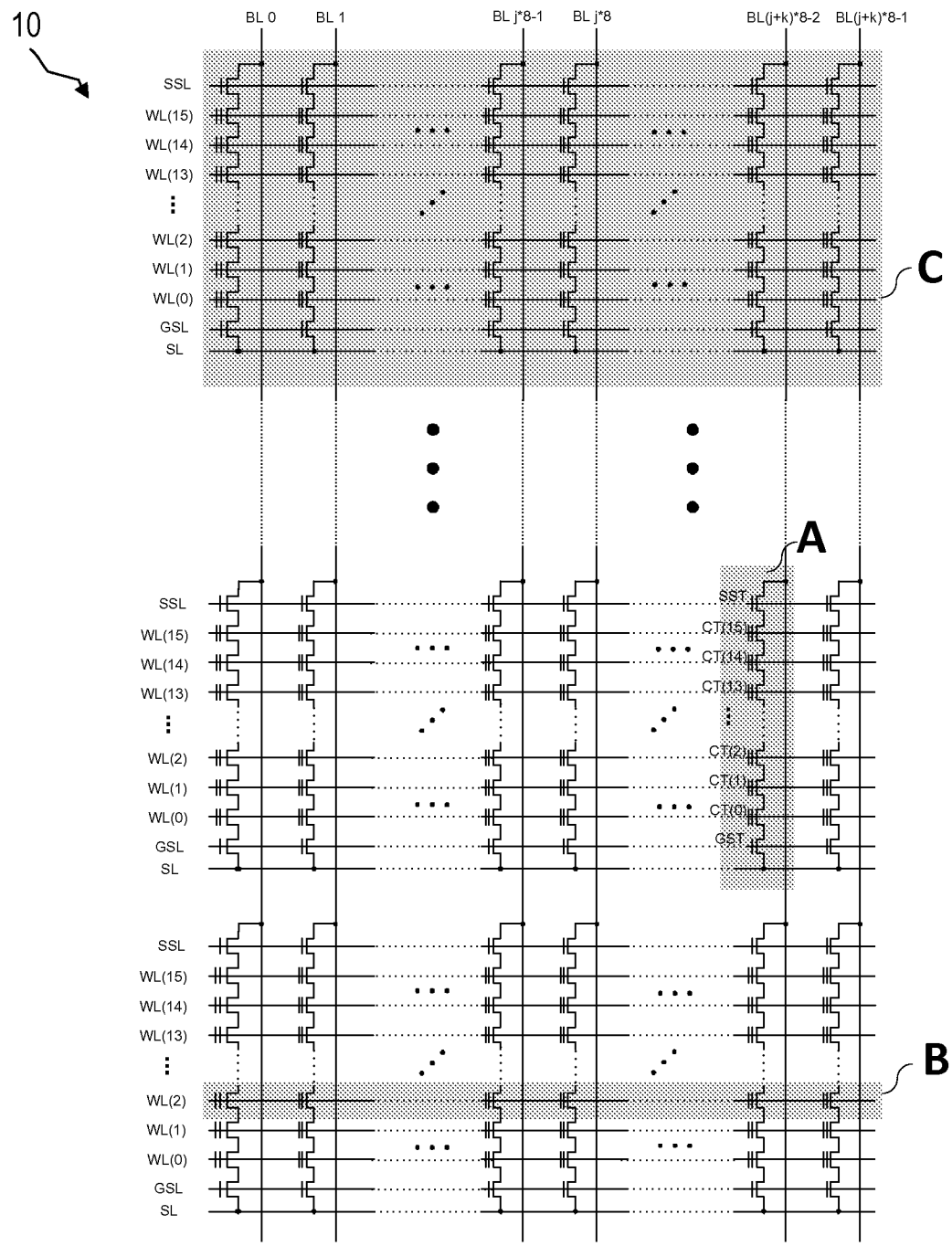
FIG. 1 is a schematic diagram illustrating elements of a NAND flash cell array.

FIG. 1 illustrates elements of a NAND flash memory device 10 according to an embodiment of the present disclosure. The NAND flash memory device 10 may comprise a string (A), a page (B), and a block (C) in a NAND Flash cell array thereof. In some implementations, the NAND flash memory device 10 may comprise fewer or greater NAND cell strings, pages, and/or cell blocks.

An example of a NAND cell string will first be described with respect to the shaded portion of box "A." At the outset, it is to be understood that although the NAND cell string may be shown as comprising a certain number of memory cells (e.g., 16 cells in this example), the number of memory cells may vary in other implementations. Briefly, the number of memory cells may be equal to any integer greater than one (e.g., cells per string=n, where n>1). Thus, this number may be greater (e.g., 32 cells, 64 cells, 128 cells, etc.) or lesser (e.g., 4 or 8 cells) for any given NAND cell string disclosed herein.

As shown in box "A," the NAND cell string may comprise at least one string select transistor (SST) placed in series with a plurality of memory cell transistors CT(0), CT(1), . . . , CT(14), CT(15), with a terminal (hereinafter referred to as drain) of the SST being connected to a bit line. For instance, a drain of the SST may be connected to the bit line denoted as BL(j=k)*8−2 in FIG. 1, and a source of the SST may be connected to the drain of the uppermost memory cell CT(15).

The NAND cell string in box "A" may also comprise at least one ground select transistor (GST) serially-connected between the memory cells CT(0)-CT(15) and a source line. For instance, a drain of the GST may be connected to the source of the bottommost memory cell CT(0), and a source of the GST may be connected to a source line (SL) or common SL (CSL). Moreover, the gate of each memory cell CT(0)-CT(15) may be connected to respective word lines WL(0) . . . WL(15), while the gate of the SST may be connected to a string select line (SSL), and the gate of the GST may be connected to a ground select line (GSL).

To specify direction within the NAND cell string in box "A," the direction towards the SSL will hereinafter be referred to as "drain direction" or "drain side," and the direction towards a GSL will hereinafter be referred to as "source direction" or "source side." Unless otherwise stated, direction within other NAND cell strings disclosed herein will be specified in the same manner.

An embodiment of a page in a NAND flash memory device 10 will now be described with respect to the shaded portion of box "B." A page may generally be defined as the smallest unit or number of bits addressed by a row address. One page is generally the smallest unit for which a read or program operation can be performed.

In some embodiments, one page may be identical to all cells connected to one word line. In other embodiments, however, cells connected to a certain word line may be subdivided into multiple subgroups, which may thus constitute multiple pages per word line, where each page in a word line has a different row address. In cases of multiple bit storage within one physical cell, different bits may belong to different pages despite being physically located in the same cell transistor (and thus connected to the same word line). Although certain aspects and techniques proposed herein may be described with respect to embodiments such as in FIG. 1 where each word line corresponds to one page, it is to be understood that the present disclosure is not so limited, as such aspects and techniques may be employed for any applicable embodiment.

Referring now to the shaded portion of box "C" in FIG. 1, an example of a cell block will now be described. In a NAND flash memory device 10 according to embodiments of the present disclosure, one cell block may constitute the smallest unit for which an erase operation can be performed. Therefore, a cell block may also be referred to as an "erase block."

Typically, a cell block may comprise an entire assembly of NAND cell strings. Thus, in a cell block 106 such as shown in box C, each NAND memory cell string may share common word lines, ground select lines, and string selection lines. In some embodiments, the cell block 106 may be arranged with other cell blocks to construct an array of cell blocks.

Figure 2:
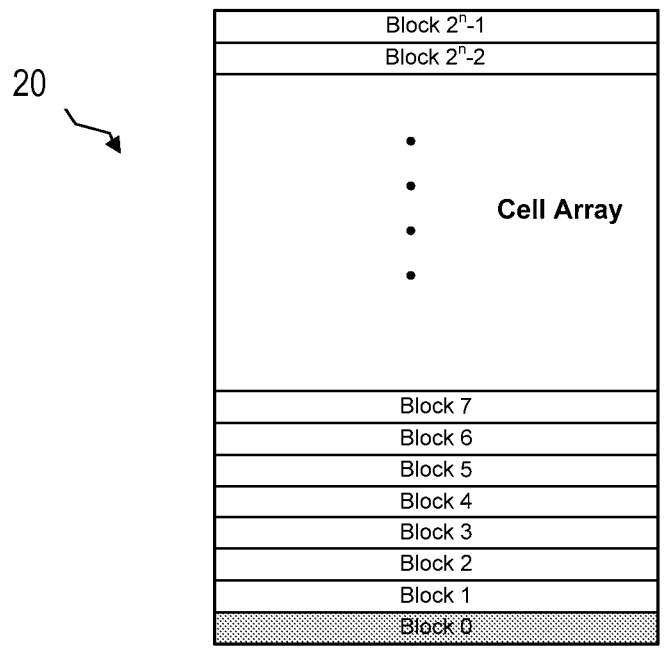
FIG. 2 is a simplified view of a structure of the NAND flash cell array.
Figure 3:
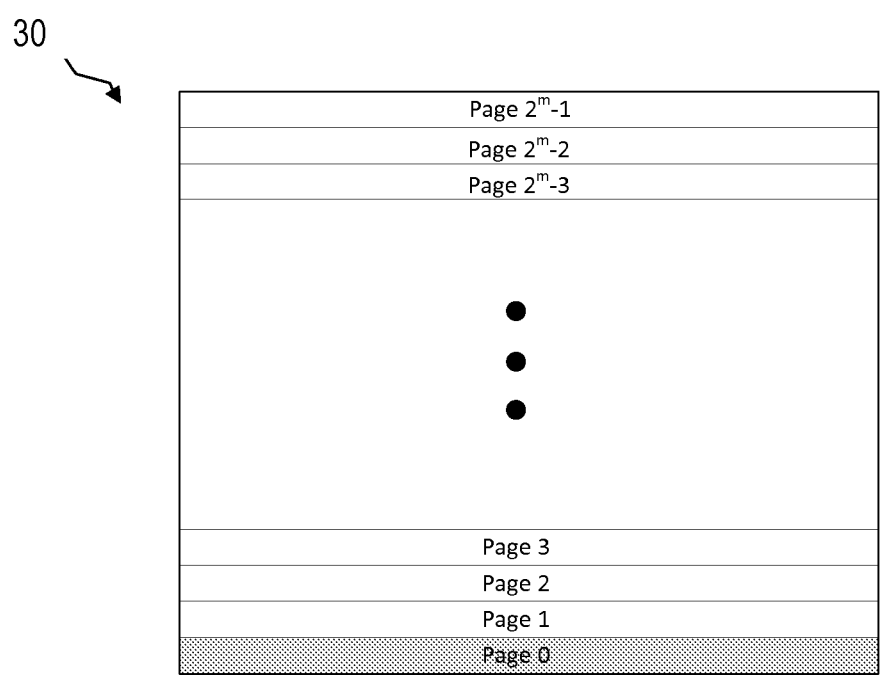
FIG. 3 is a simplified view of a structure of one NAND flash block.
Figure 4:
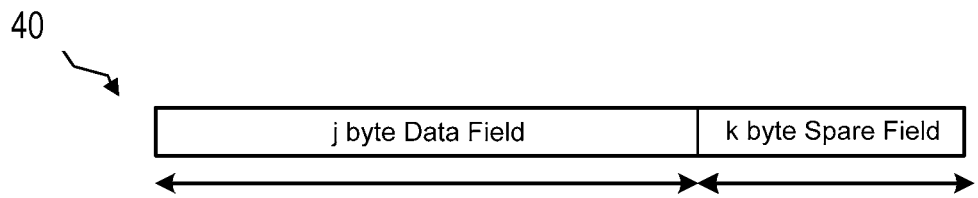
FIG. 4 is a simplified view of a structure of one NAND flash page.

FIGS. 2, 3, and 4 illustrate examples of a cell array structure 20, a NAND flash bock structure 30, and a NAND flash page structure 40, respectively. In these examples, it may be assumed that a row address is made up of n bits for a block address, and m bits for a page address. As shown in FIGS. 2 and 3, a cell array structure 20 may comprise $2^n$ erase blocks, with each block 30 subdivided into $2^m$ programmable pages. Moreover, each page 40 may be divided into a Data Field and a Spare Field, as shown in FIG. 4.

The Data Field defines a j-byte storage region, while the Spare Field defines a k-byte area that may be used for error management functions. Assuming these two fields make up a page 40, the number of bytes per page 40 may be expressed as follows: 1 page=(j+k) bytes. Assuming a block 30 comprises $2^m$ pages, the number of bytes per block 30 may be expressed as follows: 1 block=$2^m$ pages=(j+k) bytes*$2^m$. Thus, assuming a cell array 20 comprises $2^n$ blocks, the number of bytes in the array 20 may be expressed as follows: Total Memory Array Size=$2^n$ blocks=(j+k) bytes*$2^{m+n}$.

Basic Cell Operations

Figure 5:
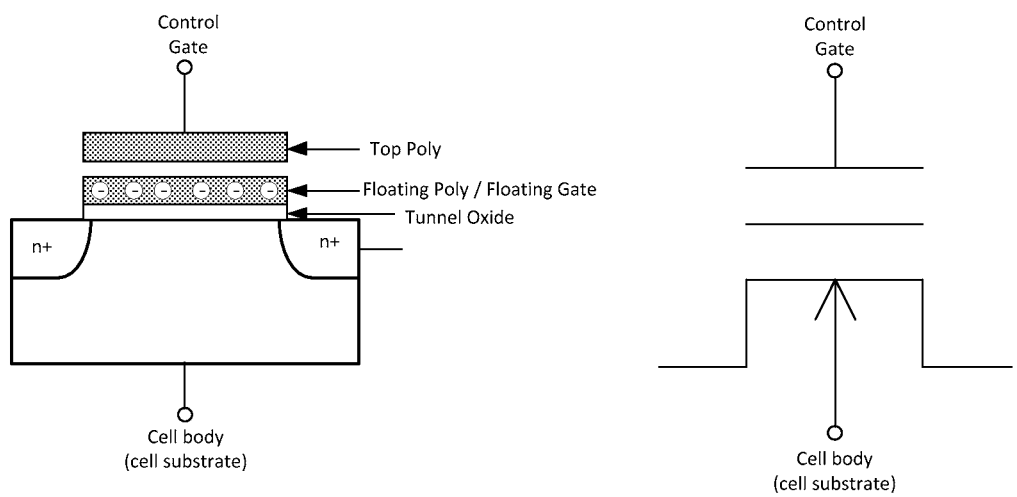
FIG. 5 is a simplified view of a structure of a NAND flash cell transistor.

FIG. 5 illustrates the structure of a NAND flash cell according to an embodiment of the present disclosure. NAND flash cell transistors typically store information by trapping electrons in a floating node or gate. The electrons trapped in the floating node of a cell transistor modify its threshold voltage to different levels depending on the data (0 or 1) stored in the cell. The threshold voltage of the cell transistor influences the channel resistance of the cell transistor.

In some embodiments, memory cells may store two logic states, data '1' and data '0,' with each memory cell corresponding to one bit. As such, a flash memory cell may have one of two threshold voltages corresponding to data '1' and data '0'. These types of memory cells may be referred to as single-level cells (SLCs). In other embodiments, cells of a NAND flash device may be programmed to have more than two threshold levels. Thus, multiple bits may be stored in one physical cell. These types of cells may be referred to as multi-level cells (MLCs). Those of ordinary skill in the art will understand that embodiments of the present disclosure may apply equally to NAND memory devices with single- and/or multi-level cells (e.g., even if no explicit reference is made to one or the other).

Figure 6:
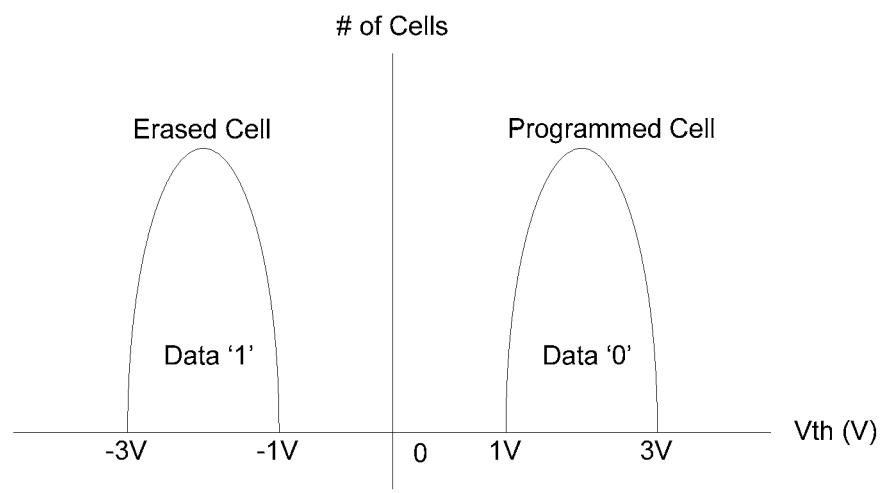
FIG. 6 illustrates a threshold voltage distribution graph for single-level cells.
Figure 7:
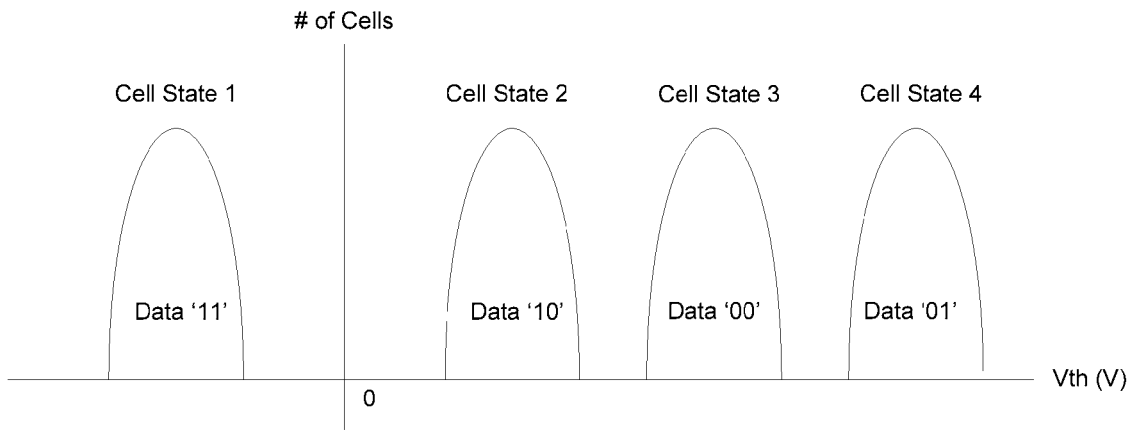
FIG. 7 illustrates a threshold voltage distribution graph for multi-level cells.

FIGS. 6 and 7 illustrate threshold voltage (Vth) distribution graphs for SLCs and MLCs, respectively. As discussed further below, variations in voltages during erase and program operations cause the erased and programmed threshold voltages to become distributed within a voltage range. For example, the graphs in FIGS. 6 and 7 show that erased memory cells may have a negative threshold voltage ranging from −3V to −1V, while programmed memory cells may have a positive threshold voltage ranging from 1V to 3V.

Referring now to FIGS. 8-11, techniques will be described for performing erase, program (or write), and read operations in a NAND flash memory device 10. Typically, a NAND flash memory cell may be erased and programmed using a tunneling effect known as Fowler-Nordheim (F-N) tunneling. An example of performing an erase operation using F-N tunneling will first be described with respect to FIG. 8.

Figure 8:
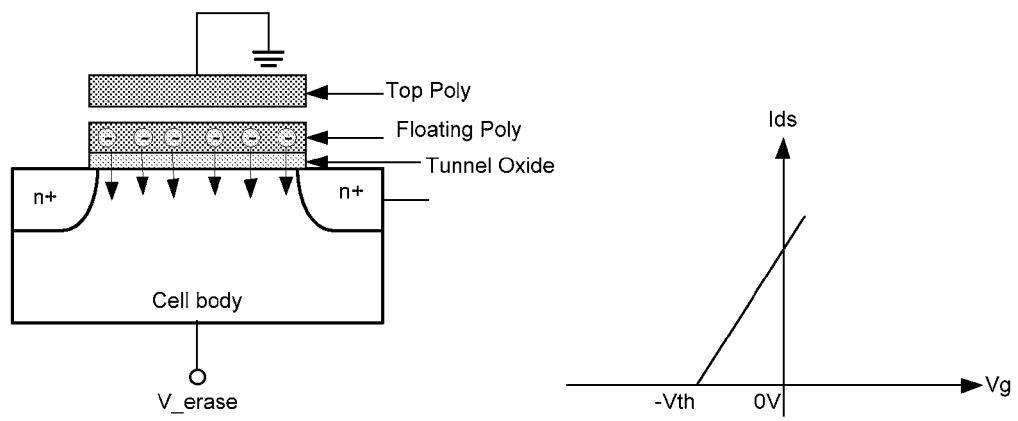
FIG. 8 is a schematic illustrating the state of a flash memory cell during an erase operation.

During an erase operation, the top poly electrode (i.e. top gate) of the memory cell may be biased to Vss (ground), while the cell body may be biased to an erase voltage (V_erase). This can cause a floating state in which the source and drain of the memory cell may be floated, or they may be automatically biased to the erase voltage (V_erase) in cases where the source and drain comprise N+ diffusion layers (e.g., due to junction-forward-bias from the cell body to the source/drain). With this erase bias condition, trapped electrons (charge) in the floating poly layer (i.e. floating gate) may be emitted uniformly to the substrate through the tunnel oxide. As shown in FIG. 8, the cell threshold voltage (Vth) of the erased cell becomes negative (e.g., between −3V to −1V). In other words, the erased cell transistor is set to an on-state (e.g., logic "1") with a gate bias voltage of zero volts (Vg=0V).

Figure 9:
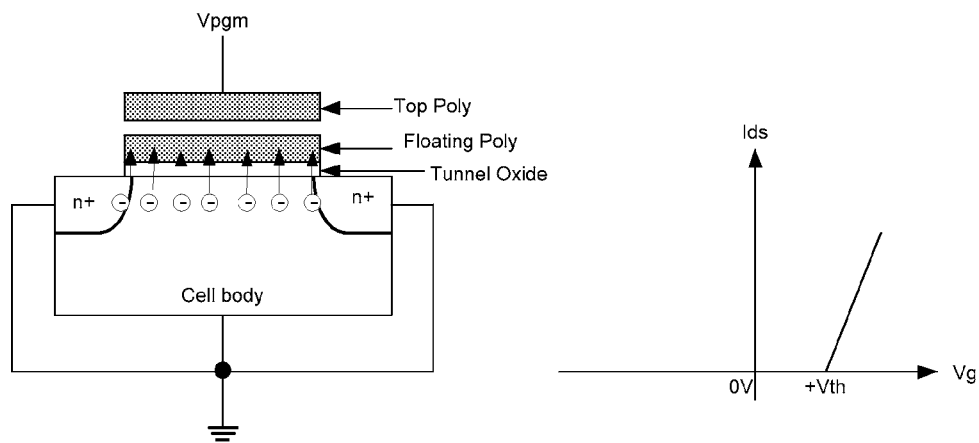
FIG. 9 is a schematic illustrating the state of a flash memory cell during a program operation.

An example of a program operation using F-N tunneling will now be described with respect to FIG. 9. In general, a memory cell may be programmed by applying a high voltage to its gate while keeping its source and drain terminals grounded. For instance, the top poly layer (i.e., top gate) of the memory cell may be biased with a program voltage Vpgm (e.g. 20V), while the substrate, source, and drain of the memory cell may be biased with a ground voltage (e.g., Vss=0V). The high program voltage (Vpgm) induces a channel under the tunnel oxide. Since this channel is electrically connected to the source and drain while being tied to ground (Vss=0V), the channel voltage (Vch) also becomes tied to ground. Due to the difference between the program and channel voltages (Vpgm−Vch), electrons from the channel may be uniformly injected (or "tunneled") to the floating poly layer (floating gate) through the tunnel oxide. As shown in FIG. 9, the cell threshold voltage (Vth) of the programmed cell becomes positive (e.g., between 1V and 3V). In other words, the programmed cell will turn off (e.g., logic "0") with a gate bias voltage of zero (Vg=0V).

Figure 10:
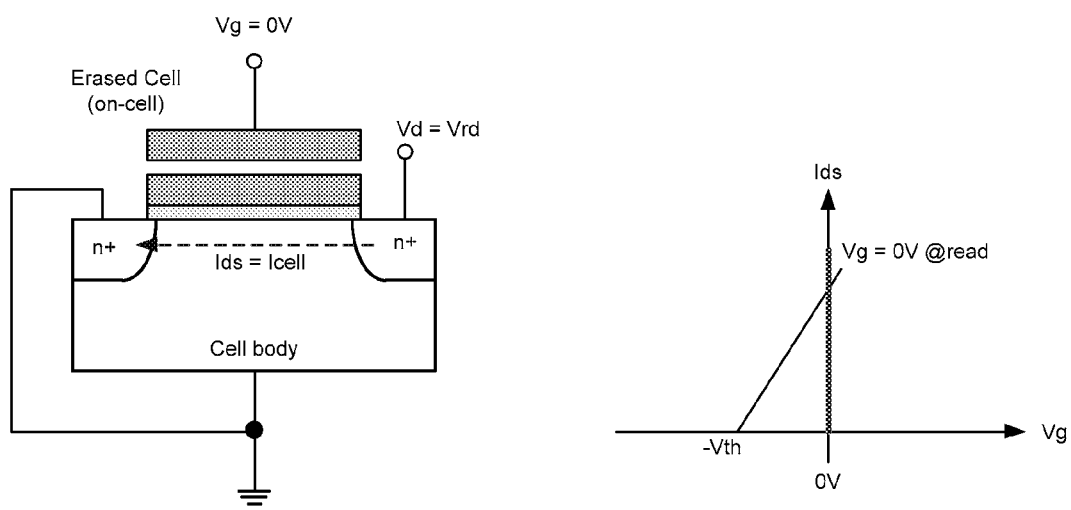
FIG. 10 is a schematic illustrating the state of an erased flash memory cell during a read operation.
Figure 11:
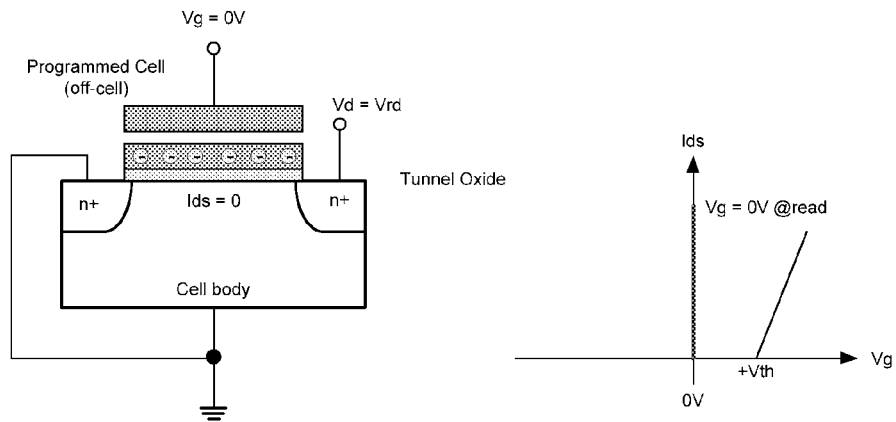
FIG. 11 is a schematic illustrating the state of a programmed flash memory cell during a read operation.

An example of performing a read operation will now be described with respect to FIGS. 10 and 11. In order to read cell data, the gate of the selected memory cell may be driven to 0V and the drain may be biased to a read voltage (e.g., Vrd=5V), while the source of the selected cell may be set to 0V. If the cell is in an erased state (e.g., having a negative threshold voltage) as shown in FIG. 10, the erased cell will turn on. Thus, a cell current (Icell) from the drain to the source will flow under the given bias condition. In contrast, if the cell is in a programmed state (having a positive threshold voltage) as shown in FIG. 11, it will not turn on. Thus, no cell current will flow from the drain to the source under the given bias condition.

In some embodiments, a sense amplifier may be connected to each bit line. The sense amplifier may be configured to sense and latch cell data. For instance, an erased cell may be sensed by the sense amplifier as data '1' (on-state), while a programmed cell may be sensed by the sense amplifier as data '0' (off-state).

Page Read

Figure 12:
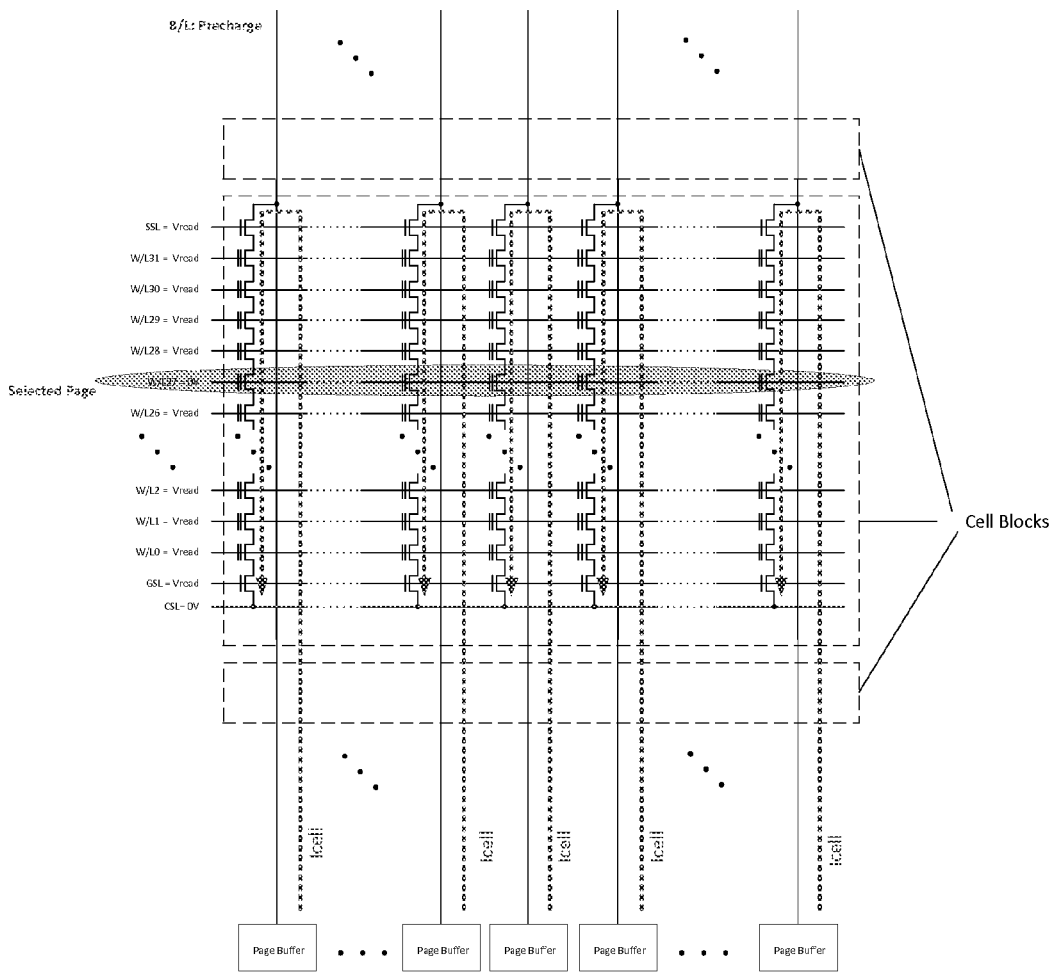
FIG. 12 is a schematic diagram illustrating bias conditions of cell transistors during page read operations.

Bias conditions during page read operations will now be described with respect to FIGS. 12-14. In FIG. 12, a selected word line may be set to 0V, while unselected word lines, SSL, and GSL may be biased to a read pass voltage (Vread) that is sufficiently high to render each unselected cell transistor conductive regardless of its programmed state (e.g., if Vth is positive or negative). In addition, a common source line (CSL) may be set to ground. With read bias conditions, the voltage threshold (Vth) of the selected cell determines cell current (Icell). This cell current (Icell) may be sensed by a bit line sense amplifier in a page buffer, and an entire page may then be read in parallel. In order for a read operation to work without disturbance, the source line (SL) should be solidly tied to ground without any modification by the cell currents.

Block Erase in NAND Flash

Figure 15:
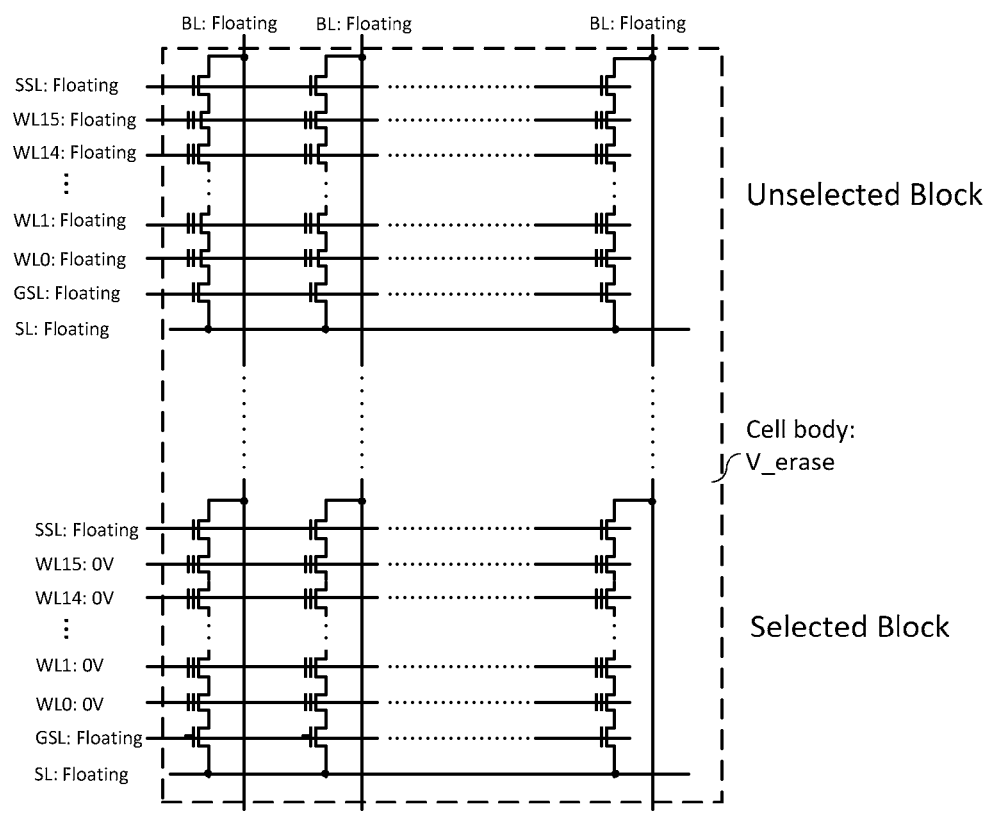
FIG. 15 is schematic diagram illustrating bias conditions during an erase operation for a selected block and an unselected block.

FIG. 13 illustrates the structure of a cell array substrate for a NAND flash device 10 according to an embodiment of the present disclosure. The cell body may be formed by a pocket p-well, which may be isolated from the p-substrate of the chip. FIGS. 14 and 15 illustrate typical bias conditions during erase operations.

As shown in FIG. 14, the cell body may be biased to a relatively high erase voltage (e.g., V_erase=18~20V), while the floating bit lines and source lines (SL) in the selected block may be clamped to V_erase-0.6V through the forward biased source/drain junctions of the string select line (SSL) and ground select line (GSL) transistors. At the same time, all word lines (WL0-WL15) in the selected block may be biased to 0V, as the SSL and GSL are biased to the erase voltage (V_erase). In turn, all cells within the selected block may be erased by F-N tunneling as previously described.

However, due to the arrangement of the memory array, all the cells along the same word line may receive the same high erase voltage. More specifically, with the source/drain/substrate of cells in the selected block being electrically connected, the substrate of the cells may be biased to the erase voltage (V_erase), the erase operation must occur on the entire block. In this case, the minimum erasable array size will be a block. As a result, a disturb event may occur if the threshold voltage (Vth) of unselected memory cells unintentionally shift (e.g., cause a change in logic state).

With erase operations being performed on a block basis, certain measures should be made to prevent the erasure of memory cells in unselected blocks sharing the same cell substrate. In some aspects, a self-boosting inhibit scheme may be employed in which a voltage may be applied such that all word lines in unselected blocks are floated during erase operations. In turn, the series capacitances through the substrate and word lines are coupled. The capacitive coupling between the substrate and word lines cause a boosting effect in which the floated word lines in unselected blocks rise to nearly erase voltage (V_erase) or other level sufficiently high to inhibit F-N tunneling, with the exact value depending on the coupling ratio (the word line level rises to about 90% of V_erase when the substrate of the cell array is driven to V_erase). The boosted voltage of the word lines in the unselected blocks can reduce the electric field between the cell substrate and word lines. As a result, erasure of memory cells in unselected blocks may be prevented. The bias conditions described herein are used for examples and variations may exist.

Page Program & Program Inhibit

As previously discussed, a program operation of a single cell may entail applying a high program voltage (Vpgm) to the control gate, whereas a channel voltage (Vch) under the tunnel oxide of the cell transistor may be tied to ground level (e.g., Vss=0V). Cells which are intended to be programmed during a program operation may hereinafter be referred to as "program cells" or "selected cells." A string to which a cell intended to be programmed belongs may hereinafter be referred to as a "selected string" or "program string," and bit lines connected to such strings may hereinafter be referred to as "program bit lines" or "selected bit lines." In contrast, strings to which cells not intended to be programmed may hereinafter be referred to as "unselected strings" or "program inhibited strings," and bit lines connected to such strings may hereinafter be referred to as "program inhibit bit lines" or "unselected bit lines."

According to some implementations, the program operation schemes described above may be expanded to entire pages and strings belonging to one block. In such implementations, a method according to embodiments of the present disclosure may be employed for supplying the needed bias conditions during program operation. Moreover, a channel self-boosting program inhibit scheme may also be employed to ensure no cells are inadvertently programmed. For instance, cells not intended to be programmed may belong to unselected strings, yet nevertheless be connected to selected word lines. Thus, when a program voltage is applied (Vpgm), the control gates of these cells may become biased with the program voltage (Vpgm).

Figure 16:
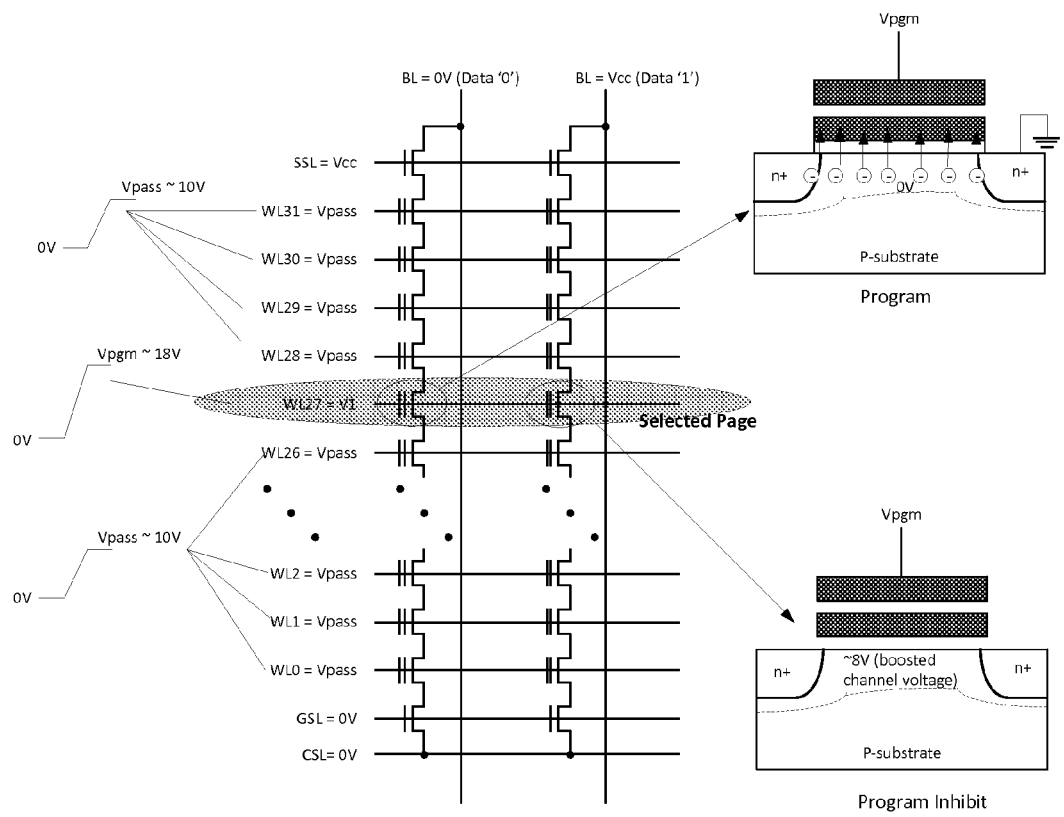
FIG. 16 is a schematic diagram illustrating page bias conditions during a program operation.

An example of using the channel self-boosting program inhibit scheme for applying the needed bias conditions to selected cells will be described with respect to FIG. 16. As discussed above, a program voltage (Vpgm) may be applied to the control gate of a selected cell through the word line to which the selected cell to be programmed is connected. For brevity, this word line may hereinafter be referred to as the "selected word line." The strings select transistor (SST) of the selected string may be turned on with Vcc voltage being applied to the string select line (SSL) and the ground select transistor (GST) being turned off. The bit line voltage for a selected cell to be programmed with data "0" may be set to Vss=0 V.

Thus, the ground level voltage (Vss) may be supplied to the channel of the selected cell through the program bit line and the SST to which this particular string is connected, and through the serially-connected cell transistors on the drain side of the selected cell (i.e., between the selected cell and the SSL). These "drain side" cells may be in a turned-on state with a pass voltage (Vpass) applied to their control gates to be able to pass on the channel voltage (Vss).

For reasons related to program inhibit conditions (described below), source side cells may also be turned on with the pass voltage (Vpass) applied to their control gates. A continuous channel may then be formed from the bit line to the selected cell (and beyond) with a channel voltage biased to zero (Vch=0V). When a program voltage (Vpgm) is applied to the gate of a selected cell, the large potential difference between gate and channel level voltage results in F-N tunneling of electrons into the floating gate.

For program inhibited cells (i.e. cells which should stay in an erased state with data logic "1") and program inhibited strings, the connected program inhibit bit line may be set to an inhibit voltage of Vcc. For program inhibit, the bit line level voltage of Vcc may initially pre-charge the associated channel through the turned on SST transistor, the gate of which being biased with Vcc as it is connected to the same SSL, which also turns on the SST transistors of program strings. The coupled channel voltage then rises, and once it reaches to about Vcc minus Vth (Vth is the threshold voltage of the SSL transistor), the SST transistor shuts off and the string channel of the program inhibit string becomes a floating node.

Once the word lines of the unit string rise during program operation (e.g., when the selected word line rises to the program voltage (Vpgm) and when the unselected word lines reach the pass voltage ((Vpass)), the series capacitances through the control gate, floating gate, channel, and bulk are coupled and the channel potential (Vch) may be automatically boosted beyond the pre-charge level of Vcc-Vth (SSL). Moreover, the word lines on the source side of the selected cell may also rise to the pass voltage (Vpass) to participate in the channel-boosting. In some cases, the floating channel voltage may rise to approximately 80% of the gate voltage. Thus, the channel voltages of program inhibited cells may be boosted to approximately 8V in a case where program voltage (Vpgm) set at about 15.5-20V and pass voltage (Vpass) set at about 10V are applied to the control gates. The resulting high channel voltage can then prevent F-N tunneling in the program inhibited cells.

Figure 17:
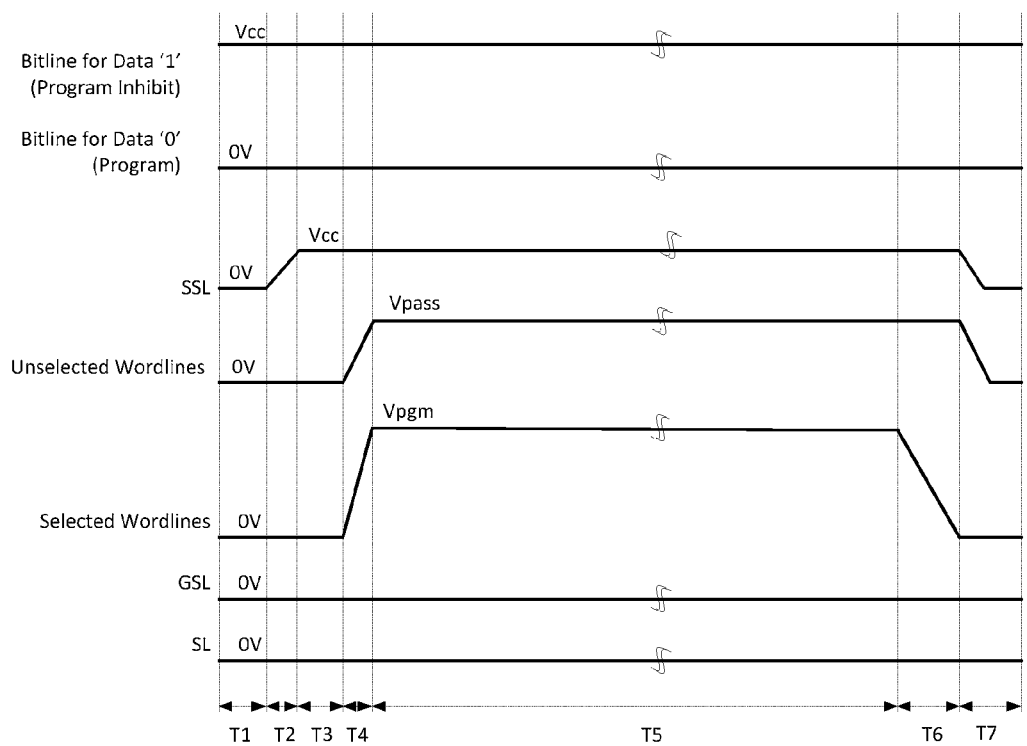
FIG. 17 illustrates a timing diagram of voltages during a program operation.

FIG. 17 is a timing diagram illustrating variations in voltages during a program operation. T1 denotes an initial state where gates of memory cells, SSL, and GSL are biased to 0V, while bit line voltages for programming cells and for inhibiting programming of cells are applied. As shown in the timing diagram, the bit line for data '1' is biased to Vcc and the SSL rises to Vcc during period T2. At period T3, voltage levels are maintained until the next period T4, at which point all word lines begin to rise. At T5, the selected word lines are driven to the program voltage (Vpgm), and the unselected word lines are driven to the pass voltage (Vpass). During period T6, the selected word lines begin to drop until reaching 0V, while the unselected word lines and SSL do not drop to 0V until the final period T7.

The voltage level transitions shown in FIG. 17 are provided to describe a general sequence of events, and are not intended as a restriction to specific timing relationships. For instance, numerous variations of this timing diagram may be possible in other implementations, such as those where multiple pulses for program and pass voltages (Vpgm and Vpass) may be applied. Those skilled in the art will understand that voltages and other values used for erase, read, and program operations may depend on various factors such as design and fabrication parameters of memory cells. Thus, although certain embodiments disclosed herein may relate to the timing diagram given in FIG. 17, it is to be understood that embodiments of the present disclosure are not limited to any particular timing program scheme.

Vertical Cell Transistors

The desire to reduce manufacturing costs per data bit has driven the NAND flash industry to reduce the size of cell transistors. Due to limitations imposed by photolithography tools and limits of reducing the physical transistor size, schemes have been proposed in which NAND cells are stacked in a direction perpendicular to the chip surface. In this manner, the effective chip area per data bit may be reduced without relying upon a physical reduction in cell transistor size.

Figure 18:
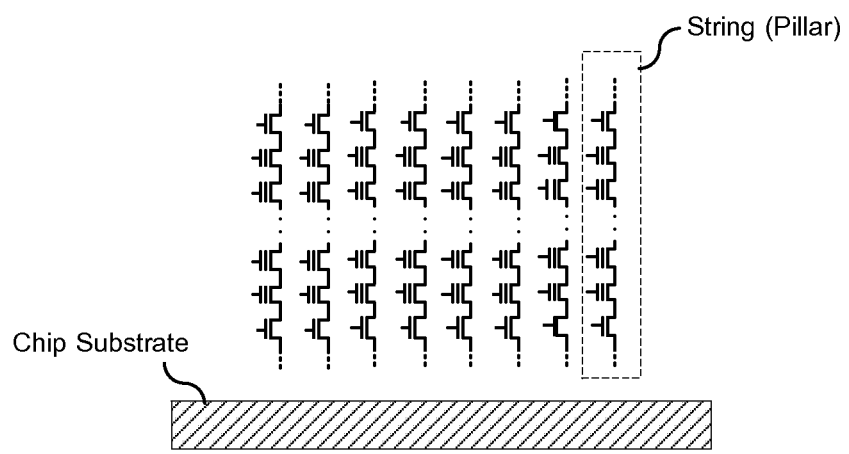
FIG. 18 is a schematic diagram of a vertical channel NAND flash device.

Additional details related to stacked NAND flash transistor cells will be described with respect to FIGS. 18 and 19. From a geometrical perspective, two different types of stacked NAND devices may exist. FIG. 18 illustrates a first type in which cell strings run in a direction perpendicular to the chip substrate, wherein cells belonging to the same string are stacked vertically on top of each other. Vertical NAND cell architectures according to this first type may hereinafter be referred to as "Vertical Channel NAND" or "VC NAND."

Figure 19:
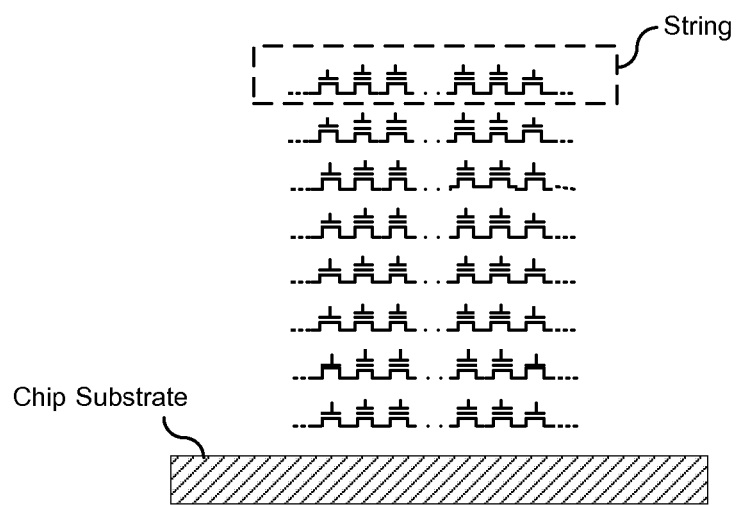
FIG. 19 is a schematic diagram of a vertical gate NAND flash device.

FIG. 19 illustrates a second type in which cell strings run in a direction parallel to the chip substrate, wherein cells belonging to the same string are aligned in a direction parallel to the chip surface (e.g., as in conventional NAND cells), but different strings are stacked vertically on top of one another. Vertical NAND cell architectures according to this second type may hereinafter be referred to as "Vertical Gate NAND" or "VG NAND," regardless of specific details regarding the cell transistor's internal structure.

In the present disclosure, it may be assumed that NAND cell transistors comprise n-channel transistors on p-type (or undoped) substrate. However, this not a requirement. For example, the embodiments disclosed herein would be similarly applicable if n- and p-type impurities were interchanged so as to form p-channel transistors on n-type substrate (or if the substrate comprises undoped silicon).

High String Resistance/Low Read Current

For read operations in NAND flash memory devices, there usually exists a direct relationship between the read current (I_read), the bit line capacitance (C_bl), and the evaluation time (t_val). Assuming that the read current (I_read) stays roughly constant during a read operation, the evaluation time may be derived from the following equation:

$$t\_val = C\_bl*(V1-V2)/I\_read,$$

where V1 is the pre-charged bit line voltage before the bit line is discharged through the cell strings, and V2 is the dropped bit line voltage at which the data is evaluated (e.g., in the case where the selected cell transistor is turned on and a string current flows).

Typical values for the parameters in the above equation may include C_bl=2 pF, I_read=50 nA, and about a 200 mV difference between V1 and V2. With these values, the evaluation time (t_val) is approximately 8 µs. It can be seen that the evaluation time will increase with the same (or substantially the same) factor that read current decreases. For stacked NAND flash cells, the read current may be expected to fall far below the level in conventional NAND flash devices (e.g., below 10 ns).

There may be various factors explaining the reason vertical NAND devices can generally have lower string currents than conventional (e.g., non-stacked) NAND devices. For instance, with many vertical NAND devices, the body of the cell transistors comprises poly-silicon. In some vertical channel (VC) NAND devices, this poly-silicon body may be manufactured as a thin film on a dielectric. In addition to the high-resistance of the poly-Si channel, the string resistance is proportional to string length. For vertical channel (VC) NAND devices, the string length may not be freely modified as the number of stacks is often a main factor driving cost reduction. Thus, the string length may be expected to increase with every new generation.

The combination of the factors described above can lead to very low current values (e.g., perhaps unreadable) as density increases, or might cause evaluation times to increase beyond an acceptable level. For instance, if read current (I_read) is assumed to be 10 nA in the previous example, the equation above would yield an evaluation time of approximately 40 µs. If the stack height (and thus the string length) doubles in the next generation of NAND devices, this would yield an evaluation time of approximately 80 µs. Thus, evaluation time may be doubled for every doubling in density. At some point, the read current may even fall below the bit line leakage current level, and thus become unreadable.

Hierarchical Read Structures & NAND Flash Read Circuits

In some implementations, solutions may be employed for reading small cell signals in memory devices that rely upon the reduction of the parasitic bit line capacitance by using a segmented or hierarchical data line structure. An issue with this class of solutions is that chip area is typically increased by the space occupied by the local sensing circuit used to read the small cell signals. Moreover, local sensing circuits can be difficult to layout in a lithography-friendly way (e.g., compared to regular cell patterns), especially if the circuits need to be laid out in a space limited by the bit line pitch.

Although common (e.g., planar, non-stacked) NAND flash devices may experience low read currents, a hierarchical read circuit structure is not typically used in NAND flash devices. One reason low read currents may be tolerated in common NAND flash devices is that area efficiency is usually given priority over read access times, which still remain within a tolerable range. Thus, read current levels have not been so low in common NAND flash devices as to make a hierarchical read structure necessary or worthwhile. However, this concept may be applied in other types of memory devices.

In DRAM memory, for example, a small amount of cell charge changes the voltage level of a low capacitance local bit line, which may be sensed by a local bit line sense amplifier. The data stored in the bit line sense amplifier may then be read out through a global data line with much higher capacitance. As previously mentioned, an issue with these types of solutions is that the space occupied by the local sensing circuit increases chip area. Another issue is that local sensing circuits are often difficult to layout. Furthermore, staged read circuits for other memory types (i.e. DRAM) typically are not space-efficient enough to be applied for NAND flash devices.

Parallel Read Current Path

In another solution, a NAND cell string may be provided with independently controllable dual gates, with front gates functioning as the storage cells and back gates functioning as pass gates during read operation. Since the back gates do not store data in a floating node (and therefore do not have increased threshold voltages), the applied pass voltage may more effectively control an inversion channel in a turned-on state, and thereby provide a low resistance path during read operation. However, this type of solution relies upon fundamental changes in cell structure and technology, and therefore, may not be practical in various implementations of the present disclosure.

Area Efficient & Litho-Friendly Layout for a Hierarchical Read Structure

With the usage of stacked cells increasing, issues with low read currents can be expected to aggravate. As discussed above, read current values may fall far below the level of common NAND flash devices, and perhaps so low as to become unreadable. Even if readable, this may cause the read time to increase by many orders of magnitude. Thus, embodiments of the present disclosure aim to provide a solution for low read current levels in memory devices, while also providing an area efficient, lithography-friendly layout for stacked NAND flash devices (e.g., device 10 in FIG. 1). These and other embodiments will be described further below with respect to FIGS. 20-29.

In an embodiment, a local read/pass circuit may be provided in a hierarchical bit line structure comprising local and global bit lines. The local read/pass circuits may connect to local bit lines for purposes such as sensing and amplifying small read currents during a read operation. The local read/pass circuits may also connect the local bit lines with the global bit lines for purposes such as passing amplified read signals during read operation, transferring pre-charge voltages from the global bit lines to the local bit lines, and for transmitting data bits from the global bit line to the local bit lines during a write operation. Furthermore, the configuration and layout of the circuits and components thereof may be designed to optimize chip area and enhance manufacturability. These and other features will be described further below with respect to FIGS. 20-29.

Figure 20:
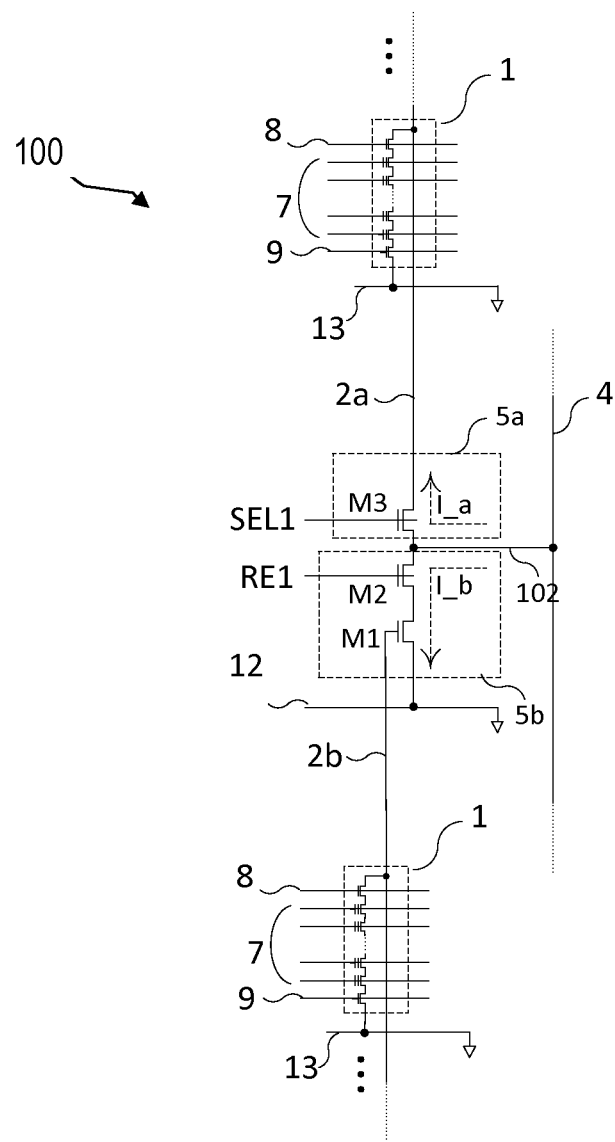
FIG. 20 is a schematic diagram of a NAND flash device according to an embodiment of the present disclosure.

FIG. 20 illustrates a schematic of a hierarchical bit line structure for a NAND flash device 100 embodying principles of the present disclosure. Briefly, the NAND flash device 100 may comprise components electrically connected and arranged to define a local read/pass circuit that may be laid out in a lithography-friendly manner. Moreover, while certain implementations may be described with respect to vertically stacked NAND flash memory devices, it is to be understood that the present disclosure is not so limited. For instance, if for any reason common (non-stacked) NAND flash memory devices (or the like) were to experience issues in which read currents may fall below tolerable levels, techniques described herein may be incorporated with such memory devices to sense lower read currents.

In general, the NAND flash device 100 may be configured similar as memory devices described above (e.g., device 10 on FIG. 1). For instance, the NAND flash device 100 comprises one or more NAND flash cell strings 1, which may include storage cells, string select transistors, and ground select transistors. As shown in FIG. 20, the gate terminals of the strings 1 may be connected to word lines 7, string select lines 8, and ground select lines 9. In addition, the sources of the strings 1 may be connected to local source lines 13, which may be permanently grounded as in some common NAND flash devices. The drains of the strings 1 may be connected to local bit lines 2a and 2b, with the bit lines 2a and 2b being connected to local read/pass circuits on each end (only one end is shown in FIG. 20).

In an embodiment, each local read circuit may comprise two subunits, such as a pass unit 5a and a read unit 5b. In other implementations, the pass and read units 5a and 5b may be disposed on opposite sides than shown. The read unit 5b may comprise a local sensing transistor M1 and a local read control transistor M2, while the pass unit 5a may comprise a local pass transistor M3 (e.g., for pre-charging local bit line and programming). The gate terminal of the local sensing transistor M1 may be connected to the local bit line 2b. The gate terminal of the local read control transistor M2 may be connected to a read enable signal line (RE1), while the gate terminal of the local pass transistor M3 may be connected to a select signal line (SEL1). Thus, the three transistors M1, M2, M3 may be connected in series to define a local read/pass circuit.

As discussed further below with respect to FIG. 28, additional transistors may be provided to define a global read/pass circuit. However, it is to be understood that more or less transistors may be provided in various implementations. Moreover, while the transistors described herein may comprise n-type Metal Oxide Semiconductor (NMOS) transistors, the present disclosure is not limited to any particular type of transistor. Furthermore, other implementations may employ more or fewer circuits (or components thereof) to perform operations described herein.

In some implementations, a global bit line 4 may be connected to the local bit lines 2a and 2b on each side, such as through a contact node 102 and through the pass and read units 5a and 5b. Depending on which local transistors M1, M2, and/or M3 are in a turned-on state, two parallel, alternative current paths may exist. As shown in FIG. 20, a first current path (I_a) may exist in the pass unit 5a, while a second current path (I_b) may exist in the read unit 5b. Before read operation, the local bit line 2a may be pre-charged through the first current path (I_a). Likewise, before read operation the local bit line 2b may be pre-charged through a similar current path that is located in a pass unit at the opposite end of the local bit line 2b (not shown in figure). During write operation, data bits may be transmitted from the global bit line 4 to the local bit line 2a through the first current path (I_a).

Depending on whether the local sensing transistor M1 is turned on or off, a pre-charged global bit line 4 may be discharged to a global source line 12 during read operation via the second current path (I_b). During read operation, the local sensing transistor M1 can be either turned on or off depending on the data bit that is read. For instance, M1 may be turned off if the local bit line 2b is discharged through a selected cell string with corresponding data in the selected cell. On the other hand, M1 may be turned on if the local bit line 2b is not discharged through a selected cell string with corresponding opposite data in the selected cell.

Although the exact value of on-currents during read operation may depend on the technology used and stored data in the cells, the current drivability of the local sensing transistor M1 may be noticeably higher compared to the cell strings. This is because the local sensing transistor M1 may be manufactured on a single crystalline chip substrate, rather than being placed in series with multiple transistors (as is the case for the cell strings). Typical sensing transistor (M1) currents may be in a range of about 1 μA, whereas string currents in a worst case scenario (e.g., strings with data '0' written to all cells) may be in a range of about 10 nA.

In some examples, the local bit lines 2a and 2b may typically have capacitances in a range of about 100 fF, whereas the global bit line 4 may typically have a capacitance of about 2 pF. Assuming a voltage difference of about 200 mV between the local bit lines 2a, 2b and the global bit line 4 (data '0' and '1') at the time of evaluation, this would yield an evaluation time of 2 μs for the first sensing stage and an evaluation time of 0.4 μs for the second sensing stage, i.e., using the previously mentioned equation (t_val=C_bl*(V1−V2)/I_read). On the other hand, if the data were to be sensed using just one sensing stage as in common (non-stacked) NAND devices, the same equation would yield an evaluation time of 40 μs.

Figure 21:
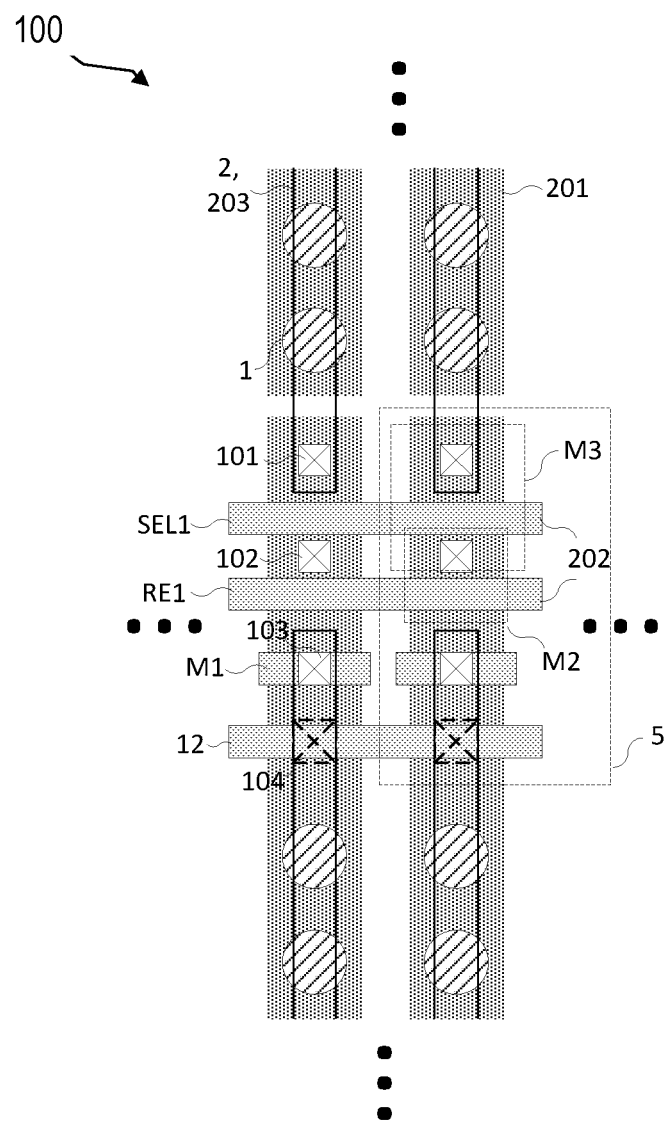
FIG. 21 is a schematic diagram illustrating a lithography-friendly layout of the NAND flash device depicted in FIG. 20.

FIG. 21 illustrates a lithography-friendly layout of the NAND flash device 100 shown in FIG. 20. It is noted that for the sake of brevity, no detailed structure of the vertical cells themselves is shown in FIG. 21, as these details may vary considerably depending on the chosen cell technology. Rather, the vertical cells are generally shown as circles and pillars, yet internal elements such as Si-body cells, gate dielectrics, or gate layers are not shown within the circles or pillars. Similarly, word lines are also not shown in FIG. 21.

According to layout shown in FIG. 21, the NAND flash device 100 may comprise a patterned active layer 201, a gate poly layer 202, a metal layer 203, and vertical cell pillars 1. In addition, one or more contacts or connectors may be provided. For instance, a first contact 101 may connect the local bit line 2 (e.g., 2a, 2b in FIG. 20) with the source/drain of the local pass transistor M3. A second contact 102 may be connected to the global bit line 4 (not shown in FIG. 21), and a third contact 103 may connect the gate of the local sensing transistor M1 with the local bit line 2. A fourth contact 104 may connect the global source line 12 with the substrate of the cell region, as well as with the source of the local sensing transistor M1. In some implementations, the global source line 12 may be formed by the gate poly layer 202.

Those of ordinarily skill in the art will appreciate that the layout shown in FIG. 21 comprises a lithography-friendly line and space pattern (e.g., each layer pattern runs only in one direction or the other). In addition, it can be seen that this layout provides a convenient solution for fitting a local read/pass circuit into one bit line pitch. For instance, by arranging the transistors M1, M2, M3 such as shown in FIGS. 20 and 21, an ordered line and space layout may be provided that optimizes the overall cell area.

Figure 22:
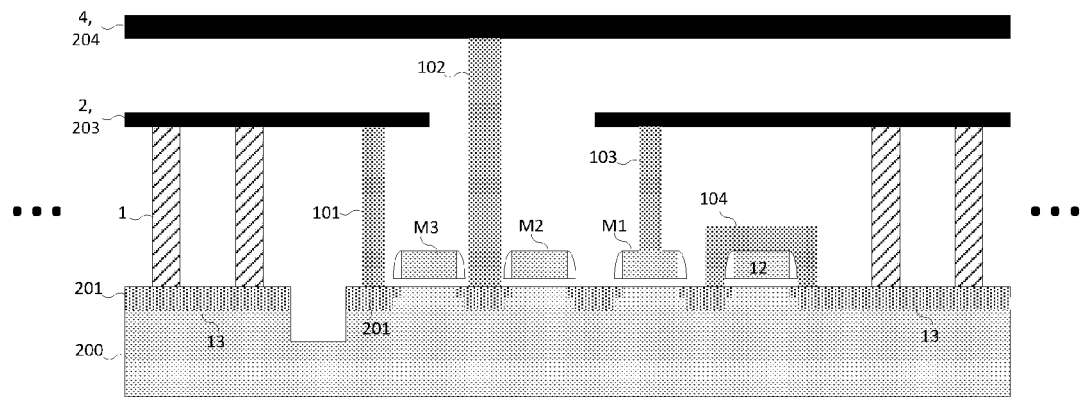
FIG. 22 is a schematic diagram illustrating a vertical structure of the NAND flash device depicted in FIG. 20.

FIG. 22 illustrates an embodiment of a vertical structure of the NAND flash device 100 shown in FIG. 20. As with FIG. 21, detailed structure of the vertical cells has not been provided in FIG. 22 for the sake of brevity. The NAND flash device 100 may be manufactured on a p-well 200 with N+ diffusion layers 201. In this implementation, NAND cells may be formed as straight pillars 1 on N+ diffusion layers 201 (e.g., as in some vertical NAND cell technologies). Thus, the diffused local source lines 13 of the cells, as well as the global source lines 12, may form a common ground node. As previously mentioned, the global source line 12 may be formed by the gate poly layer 202, and the fourth contact 104 may connect this source line 12 with the N+ diffused local source lines 13.

Figure 23:
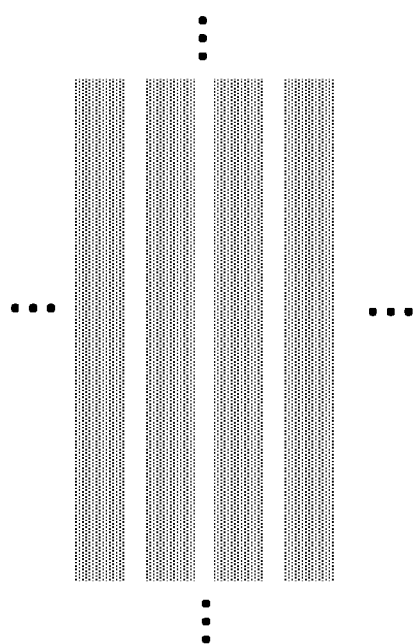
FIGS. 23 and 24 are top views of an active layer depicted in FIG. 22.
Figure 24:
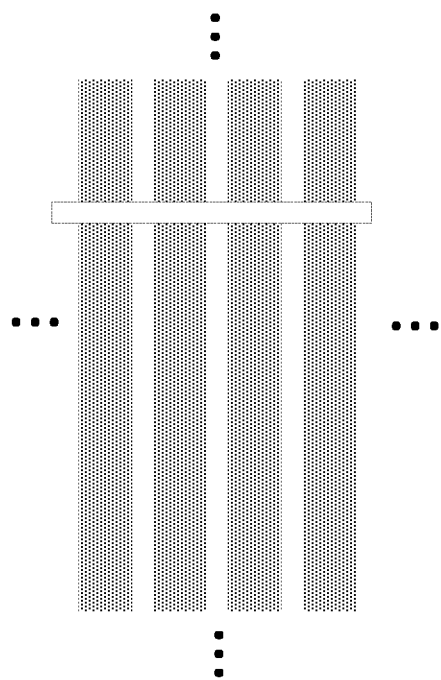

Referring now to FIGS. 23-26, a manufacturing process will be described from a lithography point of view. FIG. 23 illustrates a step in which the active layer 201 may be patterned in a line and space pattern. FIG. 24 illustrates a step in which the active line and space pattern of the active layer 201 may be trimmed to isolate the local bit line node from the source line node of the cells. Although these steps are shown separately in FIGS. 23 and 24, the patterning and trimming steps may be combined (e.g., to save costs) if the lithography process allows.

Figure 25:
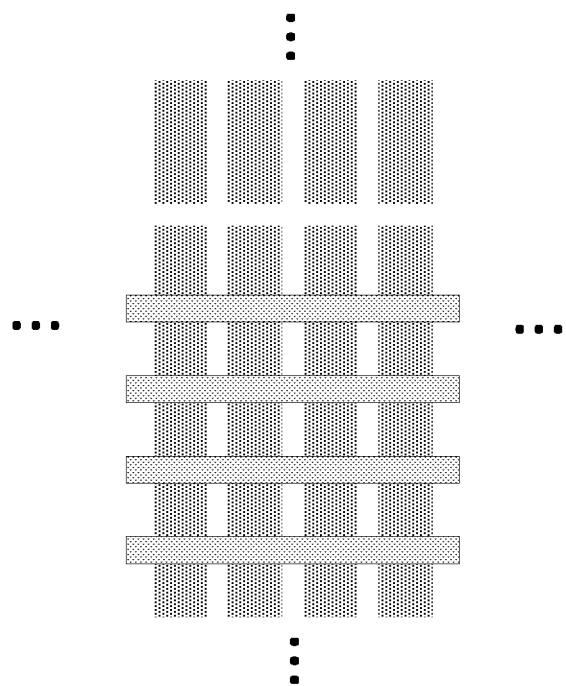
FIGS. 25 and 26 are top views of a gate poly layer depicted in FIG. 22.
Figure 26:
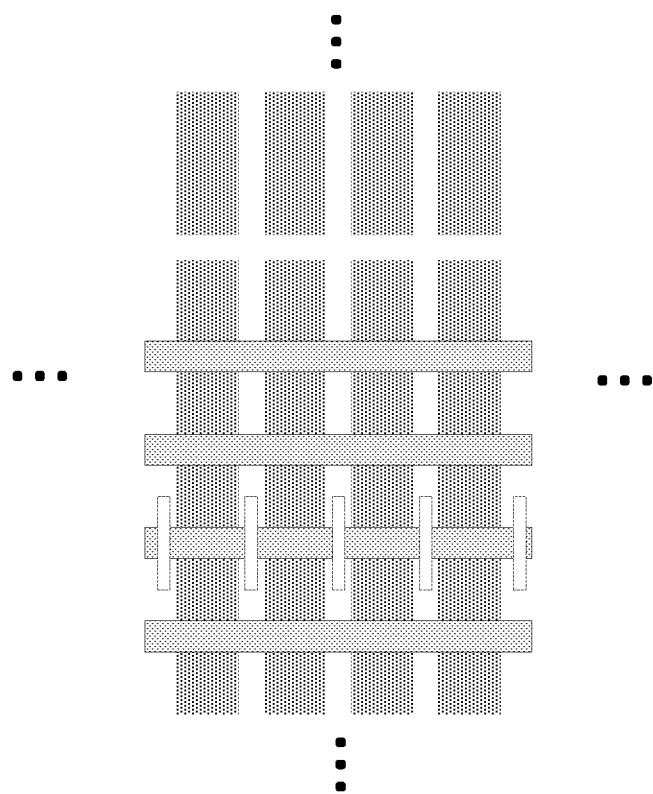

FIG. 25 illustrates a step in which the gate poly layer 202 may be patterned in a line and space pattern. FIG. 26 illustrates a step in which the gate poly line 202 and space pattern may be trimmed to isolate the gate nodes of the sensing transistors from each other. As with the active layer 201, the patterning and trimming steps shown in FIGS. 25 and 26 may be combined if the lithography process allows.

Figure 27:
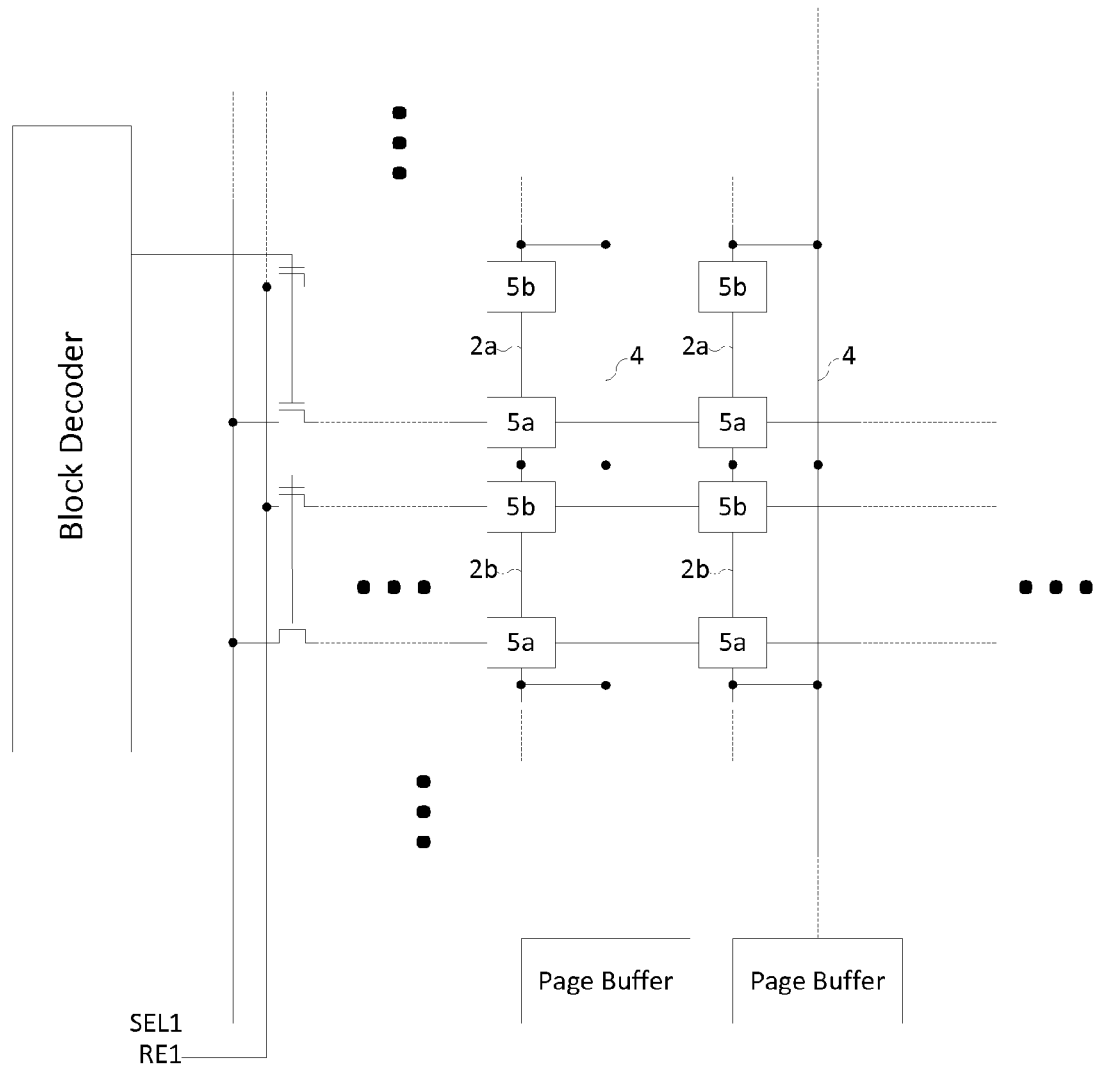
FIG. 27 is a block diagram of the NAND flash device.

FIG. 27 is a block diagram illustrating an embodiment of the NAND flash device 100 comprising local and global circuitry. In particular, the device 100 (e.g., such as shown in FIG. 20) comprises local read/pass circuits (5a, 5b) coupled to global circuits via the global bit line 4. The global circuits may comprise at least one page buffer and/or other suitable global read circuitry. Moreover, the local and global bit lines (2a, 2b and 4) may be selectively coupled to read and select signals (RE1 and SEL1) that activate certain transistors (e.g., M2 and M3) in the local read/pass circuits (5a, 5b). Additionally or alternatively, the NAND flash device 100 may comprise at least one block decoder configured to decode signals (e.g., RE1 and SEL1) such as in a similar manner that word lines, string select lines and ground select lines may be decoded. Among other things, the layout shown in FIG. 27 allows local read circuits 5b and pass circuits 5a for each local bit line 2a and 2b to be located at opposite ends (i.e., from the point of view of each bit line).

Figure 28:
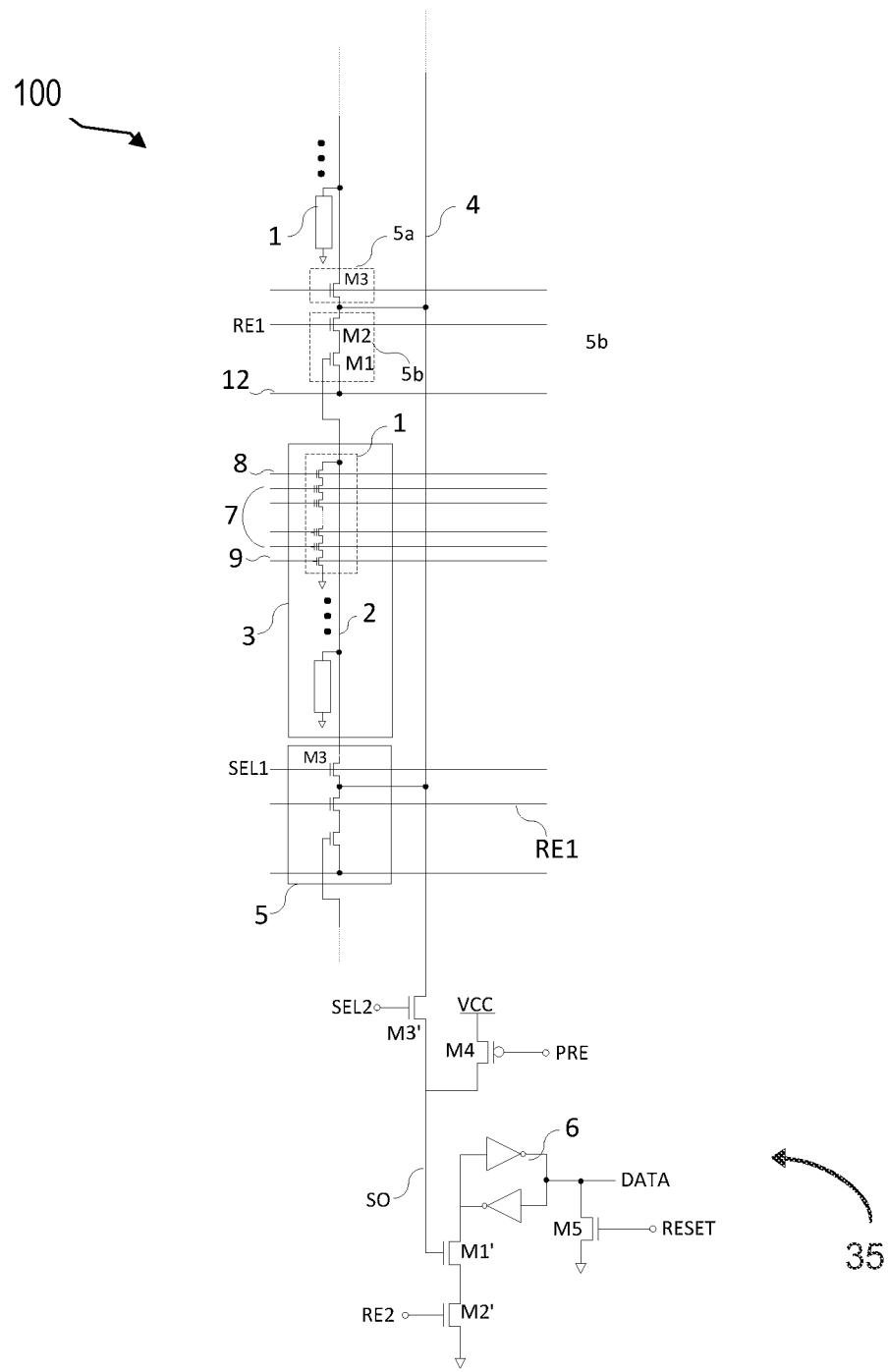
FIG. 28 is a schematic diagram illustrating the NAND flash device according to another embodiment of the present disclosure.

FIG. 28 illustrates a schematic diagram of the local/global circuitry and local/global bit lines shown in FIG. 27. The NAND flash device 100 in this schematic diagram is similar to that shown in FIG. 20, except the NAND flash device in FIG. 28 comprises a second stage sensing unit defining a global circuit 35. In addition to including at least one page buffer (e.g., see FIG. 27), the global circuit 35 may include at least three transistors M1', M2', and M3' having functionality similar to M1, M2, and M3. Since restrictions as to chip area may not be as much of a concern for the global circuit 35 compared to the local circuits 5a and 5b, the transistors M1', M2', and M3' may be aligned differently. In FIG. 28, for example, the global transistors M1', M2', and M3' are disposed on the same side in which the global bit line 4 extends, whereas the local read and pass transistors M1, M2, M3 are disposed on opposite sides of the local bit lines 2a and 2b.

According to one aspect, the global transistors may be configured as a global sensing transistor M1', a global read enable transistor M2', and a global bit line select transistor M3'. Moreover, the global circuit 35 may comprise a pre-charge transistor M4 configured to selectively receive a pre-charge signal (PRE), and a reset transistor M5 configured to selectively a reset signal (RESET). As shown in FIG. 28, the reset transistor M5 may be coupled to a latch 6, which may be implemented as cross-coupled inverters.

Figure 29:
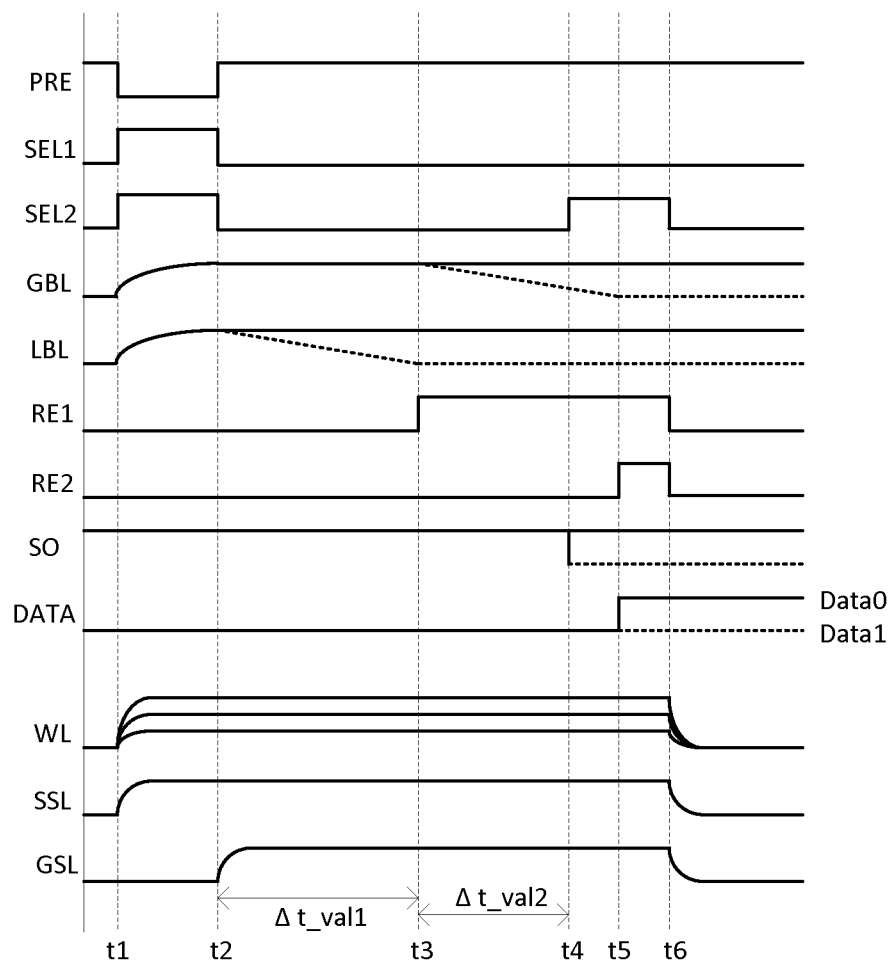
FIG. 29 is a timing diagram for a read operation according an embodiment of the present disclosure.

A method of performing a read operation according to an embodiment will be described with respect to FIG. 28 and a timing diagram shown in FIG. 29. At time t1, a string select signal (SSL) may be received to select the strings of the block to be read. In addition, a pre-charge process is initiated in which the global bit line (GBL) and local bit line (LBL) may be pre-charged to Vcc by turning on the pre-charge transistor M4, the local bit line pass transistor M3, and the global bit line select transistor M3'. This may be achieved by communicating a pre-charge signal (PRE) to the pre-charge transistor M4, communicating a first select signal (SEL1) to the local bit line pass transistor M3, and communicating a second select signal (SEL2) to the global bit line select transistor M3'. The gates of these cell transistor may be biased either by applying a read pass voltage (V_pass) to the word lines of non-selected cells and an appropriate read voltage (V_read) to the word lines of selected cells (e.g., as with common NAND flash memory devices).

The pre-charging process ends at time t2, where a pre-charge signal (PRE) may be communicated to turn off the pre-charge transistor M4, and selection signals (SEL1 and SEL2) may be communicated to turn off the global bit line select transistor M3' and the local bit line pass transistor M3. Moreover, the ground select transistors of the selected strings may be turned at this time on by applying an appropriate high voltage at the global source line (GSL) of the selected block (e.g., as with common NAND flash memory devices). Next, a first evaluation time (Δt_val1) may take place where the LBL develops e.g., the local bit line may or may not be discharged through the selected string depending on the cell data (Data0 or Data1). Thus, the local sensing transistor M1 will either be turned on or off depending on the LBL level.

At time t3, a read signal (RE) may be communicated to turn on the local read control transistor M2. Next, a second evaluation time (Δt_val2) may take place where the GBL level develops e.g., the global bit line may or may not be discharged through the local sensing transistor M1 depending on the cell data/local bit line level. At time t4, a selection signal (SEL2) may be communicated to turn on the global selection transistor M3,' wherein the voltage level of the GBL may be transferred to a sensing node (SO). In turn, the global sensing transistor M1' may either be turned on or off depending on the local bit line level. At time t5, a read signal (RE2) may be communicated to turn on the global read enable transistor M2', wherein the read data may be transferred from the SO to the page buffer latch 6. The read operation may then end at t5.

In an embodiment, the NAND device 100 may perform read and/or other operations (e.g., erase and program) in a manner similar to those performed by other memory devices. However, the NAND device 100 according to embodiments disclosed herein comprises local read/pass transistors that may be turned on or off. During a write (or program) operation, for example, the local read enable transistor M2 may be turned off at all times of the operation, while the local pass transistor M3 may remain on at all times. Alternative write sequences may also be employed in some implementations, such as where M3 may only be turned on for selected cell blocks during write operation using a block decoding structure (e.g., decoder in FIG. 27).

Alternative Cell Technologies/Metal Lines

In some embodiments, the gate poly layer 202 (shown in FIG. 22) of the NAND device 100 may be used to implement the global source line 12. Since the gate poly layer 202 may not be used as a transistor gate in this case, it may be replaced by other suitable metal lines depending on the used process technology. An example of such an embodiment can be seen in FIGS. 30 and 31. As with FIGS. 20 and 21, detailed structure of the vertical cells has not been provided in FIGS. 30 and 31 for the sake of brevity.

Figure 30:
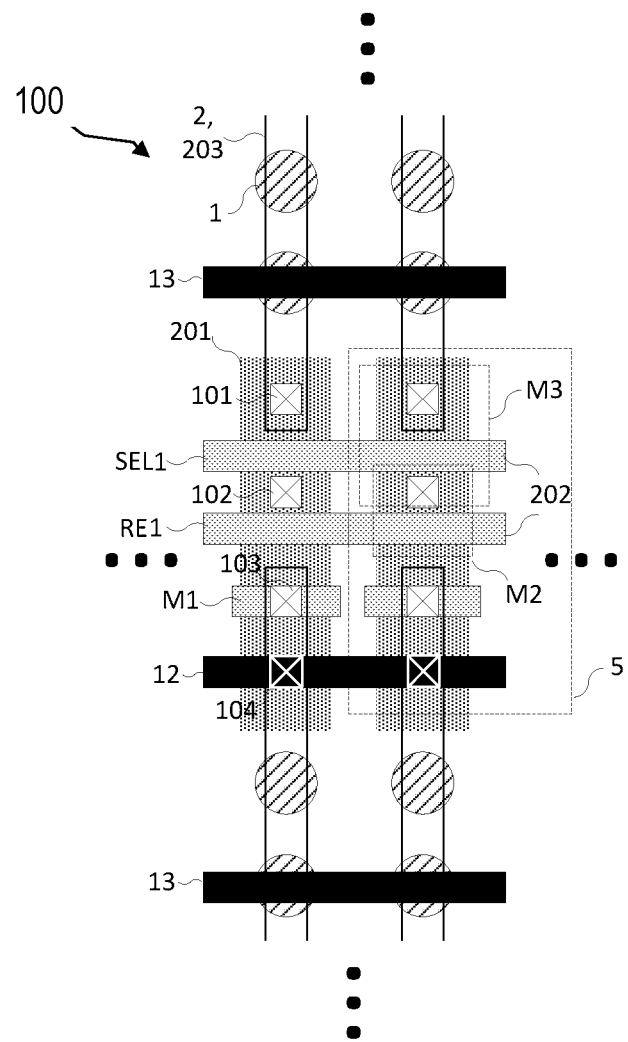
FIGS. 30 and 31 are schematic diagrams of a NAND flash device according to an embodiment of the present disclosure.
Figure 31:
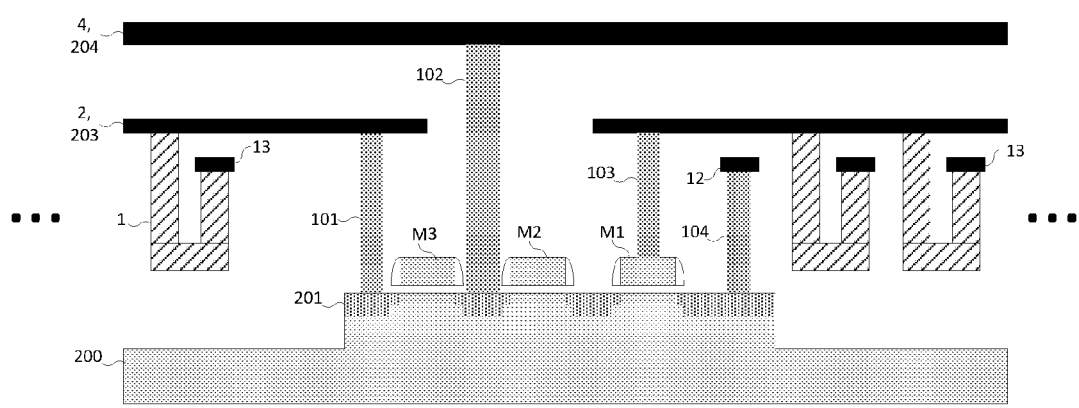

The example in FIGS. 30 and 31 may apply to technologies where cell strings are U-shaped and a dedicated metal layer is available for the cell source lines 13. This layer may also be used for the global source lines 12. According to some implementations, neither the local (cell) source lines 13 nor the global source lines 12 may be connected to any diffused substrate layer. As such, the active pattern of the local read circuits may take the shape of an island.

While it can be seen that the embodiments disclosed herein are designed to be area-efficient and lithography-friendly so as to fit into one bit line pitch, those skilled in the art will appreciate that additional measures may be taken to enhance the manufacturability of the NAND device without departing from the spirit and scope of the present disclosure. For instance, there may be other implementations in which read/pass circuits (5a, 5b) may be shared among multiple local bit lines.

Additionally or alternatively, rather than placing all local sensing transistors of a local bit line in one line, the local transistors may be placed in an alternating (staggered) pattern, e.g., to release the burden of fitting the island-like gate patterns into one bit line pitch. Furthermore, although the global sensing circuits may be shown in the figures as comprising one or more page buffers, it is to be understood that the present embodiments are not tied to any specific design of sensing circuits or page buffers, as any suitable circuits (or components thereof) may be used.

As skilled artisans will readily appreciate, the various illustrative logical blocks, modules, circuits, and method described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, ..., 50 percent, 51 percent, 52 percent, ..., 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A hierarchical bit line structure for a non-volatile memory device, the structure comprising:
    at least one local circuit configured to read currents from a first local bit line and a second local bit line of local bit lines during a read operation;
    at least one global circuit configured to read currents from global bit lines during the read operation; and
    at least one page buffer configured to store and digitize data read by the global circuit;
    wherein the at least one local circuit comprises a sensing unit connected to the first local bit line and a passing unit connected to the second local bit line,
    wherein the sensing unit comprises a local sensing transistor and a local read control transistor, and wherein the passing unit comprises a local pass transistor.

2. The structure of claim 1, wherein the sensing and passing units are configured to connect the local bit lines to the global circuit via global bit lines.

3. The structure of claim 1, wherein the local circuit is connected to the local bit lines such that the sensing and passing unit are located at opposite ends in relation to each local bit line.

4. The structure of claim 1, wherein at least one of a source, channel, or drain of the local pass transistor is connected in series with the local read control transistor, the local sensing transistor, a global source line, and a local bit line.

5. The structure of claim 1, wherein during a write operation of the local bit lines, write data is transmitted from a global bit line to a local bit line through a current path passing through the local pass transistor, and wherein where the local sensing transistor and the local read control transistor are each turned off so as to prevent an alternative current path during the write operation.

6. The structure of claim 1, wherein the memory device is a NAND flash memory cell transistor comprising cells stacked in a direction vertical to the chip surface, and wherein the cell transistor defines a body comprising polycrystalline silicon.

7. The structure of claim 1, wherein the memory device comprises an active layer and a poly gate layer, and wherein portions of the active and poly gate layers define regions in a memory cell array and the at least one local circuit having a line and space pattern such that the pattern of each layer runs only in one direction or another.

8. A split read circuit structure comprising:
   a first stage of read circuits configured to read currents from a first local bit line and a second local bit line of local bit lines during a read operation;
   a second stage of read circuits configured to read currents from global bit lines during the read operation; and
   at least one page buffer coupled to the second stage of read circuits, wherein the page buffer is configured to store and digitize data read by the second stage of read circuits,
   wherein the first stage of read circuits comprise a sensing unit connected to the first local bit line and a passing unit connected to the second local bit line, wherein the sensing unit comprises a local read control transistor and a local sensing transistor, and the passing unit comprises a local pass transistor.

9. The structure of claim 8, wherein the local read control transistor, the local sensing transistor, and the local pass transistor are connected in series with a global source line.

10. The structure of claim 8, wherein a local bit line is pre-charged through a global bit line using the local pass transistor at an end of the local bit line, and wherein a data state of the local bit line is sensed using the local read control and sensing transistors at an opposite end of the local bit line.

11. The structure of claim 8, wherein a current path flows from a global bit line to a source/drain region shared by the pass transistor and the read control transistor, then through the read control transistor and through the sensing transistor to the global source line.

12. A nonvolatile memory device comprising:
   at least one local circuit connected to a plurality of local bit lines, wherein the local circuit comprises at least one transistor configured to read currents from the local bit lines during read operations; and
   at least one global circuit connected to a plurality of global lines, wherein the global circuit is connected to the local circuit via at least one global line and local bit line,
   wherein the at least one local circuit comprises a sensing unit connected to a first local bit line of the plurality of local bit lines and a passing unit connected to a second local bit line of the plurality of local bit lines,
   wherein the sensing unit comprises a local sensing transistor and a local read control transistor, and wherein the passing unit comprises a local pass transistor.

13. The memory device of claim 12, wherein each local transistor is connected in series with one another.

14. The memory device of claim 12, wherein the memory device is a NAND flash memory cell transistor comprising cells stacked in a direction vertical to the chip surface.

15. The memory device of claim 14, wherein the cell transistor defines a body comprising polycrystalline silicon.

16. The memory device of claim 14, wherein the memory device comprises an active layer and a poly gate layer, and wherein portions of the active and poly gate layers define regions in a memory cell array and the local circuit having a line and space pattern such that the pattern of each layer runs only in one direction or another.

* * * * *